United States Patent
Bai et al.

(10) Patent No.: US 9,019,362 B2
(45) Date of Patent: Apr. 28, 2015

(54) CHARGED PARTICLE BEAM DEVICE AND A METHOD OF IMPROVING IMAGE QUALITY OF THE SAME

(75) Inventors: Jie Bai, Yokohama (JP); Kenji Nakahira, Fujisawa (JP); Atsushi Miyamoto, Yokohama (JP); Chie Shishido, Kawasaki (JP); Hideyuki Kazumi, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 443 days.

(21) Appl. No.: 13/513,280
(22) PCT Filed: Nov. 8, 2010
(86) PCT No.: PCT/JP2010/069826
§ 371 (c)(1),
(2), (4) Date: Jul. 16, 2012

(87) PCT Pub. No.: WO2011/068011
PCT Pub. Date: Jun. 9, 2011

(65) Prior Publication Data
US 2012/0274757 A1    Nov. 1, 2012

(30) Foreign Application Priority Data
Dec. 3, 2009  (JP) ................ 2009-275422

(51) Int. Cl.
*H04N 7/18* (2006.01)
*G01N 23/00* (2006.01)
(Continued)

(52) U.S. Cl.
CPC ............ *H01J 37/28* (2013.01); *H01J 37/244* (2013.01); *H01J 2237/24495* (2013.01); *H01J 2237/2809* (2013.01); *H01J 2237/2817* (2013.01); *H01L 22/12* (2013.01)

(58) Field of Classification Search
CPC .......... H01J 37/244; H01J 37/28; H04N 7/18; G02B 21/365; G02B 21/367; G02B 21/002
See application file for complete search history.

(56) References Cited

U.S. PATENT DOCUMENTS

| 6,075,902 A | 6/2000 | Kojima | |
| 8,019,161 B2 * | 9/2011 | Morokuma et al. | 382/190 |

(Continued)

FOREIGN PATENT DOCUMENTS

| JP | 1-304647 | 12/1989 |
| JP | 7-170395 | 7/1995 |

(Continued)

OTHER PUBLICATIONS

Office Action in corresponding foreign Japanese Application No. 2013-153835, mailed Jun. 17, 2014.

*Primary Examiner* — Jefferey Harold
*Assistant Examiner* — Sean Haiem
(74) *Attorney, Agent, or Firm* — Baker Botts, LLP

(57) ABSTRACT

The invention relates to a technique of improving a contrast of a lower-layer pattern in a multi layer by synthesizing detected signals from a plurality of detectors by using an appropriate allocation ratio in accordance with pattern arrangement. In a charged particle beam device capable of improving image quality by using detected images obtained from a plurality of detectors and in a method of improving the image quality, a method of generating one or more output images from detected images corresponding to respective outputs of the detectors that are arranged at different locations is controlled by using information of a pattern direction, an edge strength, or others calculated from a design data or the detected image. In this manner, a detection area of the detected signals can be expanded by using the plurality of detectors, and the image quality such as the contrast can be improved by synthesizing the detected signals by using the pattern direction or the edge strength calculated from the design data or the detected images.

14 Claims, 23 Drawing Sheets

(51) Int. Cl.
*G21K 7/00* (2006.01)
*G06K 9/00* (2006.01)
*G06K 9/46* (2006.01)
*G06K 9/66* (2006.01)
*H01J 37/28* (2006.01)
*H01J 37/244* (2006.01)
*H01L 21/66* (2006.01)

(56) References Cited

U.S. PATENT DOCUMENTS

2007/0177787 A1* 8/2007 Maeda et al. ............... 382/141
2007/0187595 A1* 8/2007 Tanaka et al. ............... 250/307
2008/0024765 A1 1/2008 Oka et al.
2009/0039261 A1* 2/2009 Toyoda et al. ............... 250/310
2009/0208090 A1 8/2009 Nishiura et al.
2009/0266985 A1* 10/2009 Nakahira et al. ............. 250/307

FOREIGN PATENT DOCUMENTS

| JP | 10-284383 | 10/1998 |
| JP | 2000-260380 | 9/2000 |
| JP | 2008-32600 | 2/2008 |
| JP | 2009-44070 | 2/2009 |
| JP | 2009-164436 | 7/2009 |
| JP | 2009-245674 | 10/2009 |

* cited by examiner

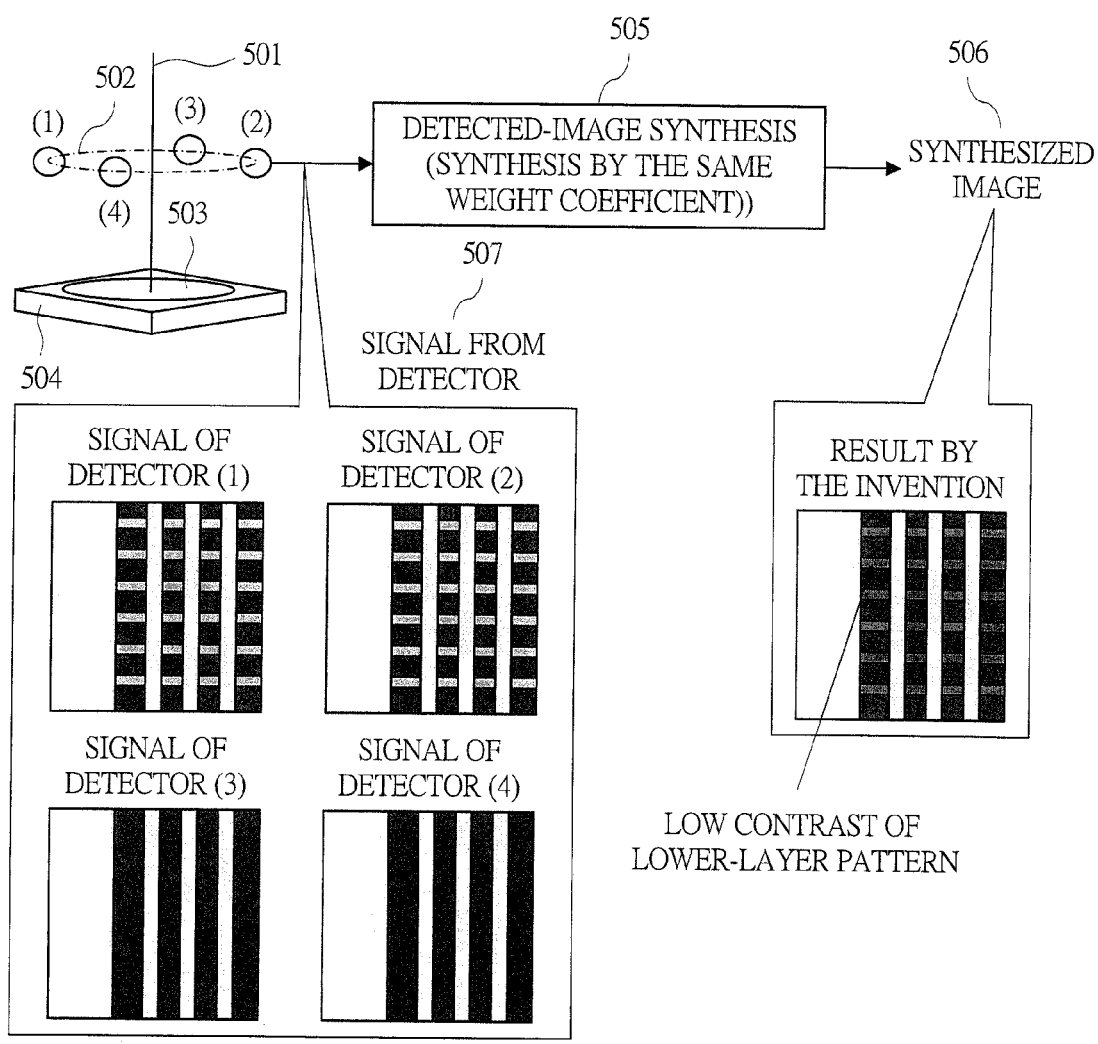

FIG. 13
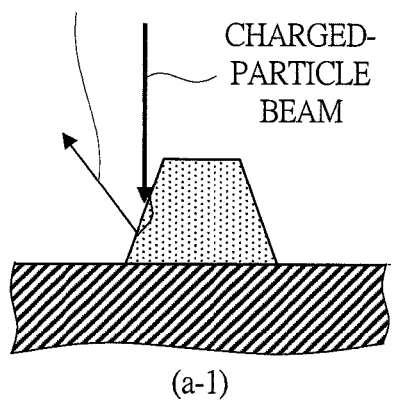
(a-1)
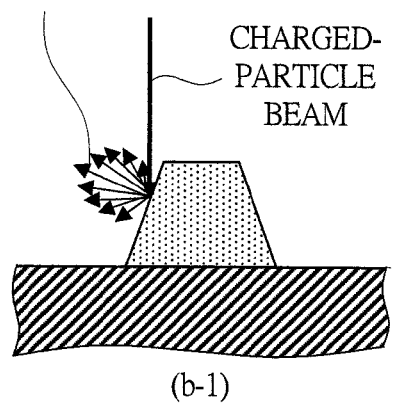
(b-1)
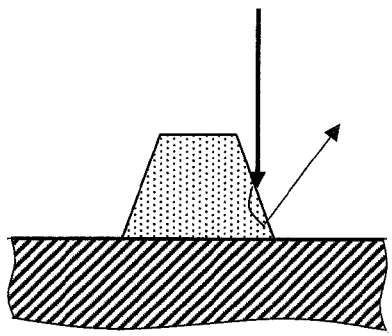
(a-2)
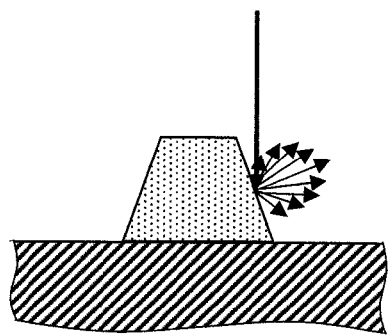
(b-2)
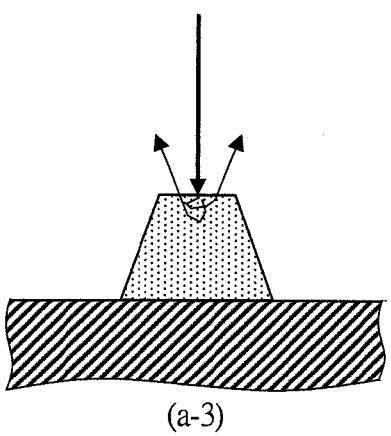
(a-3)
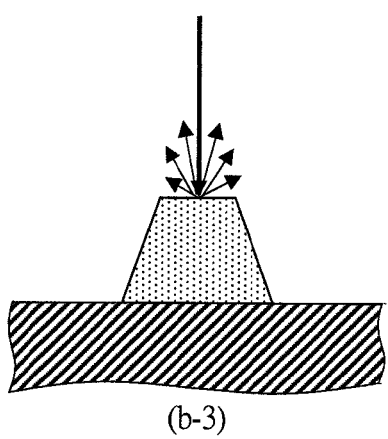
(b-3)

FIG. 14
DESIGN DATA
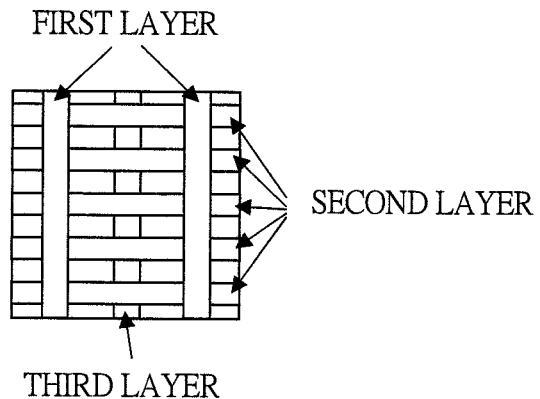
CASE OF DETERMINATION OF DETECTED IMAGE WHICH CONTAINS A LOT OF THIRD-LAYER SIGNALS BY USING FIRST AND SECOND LAYERS
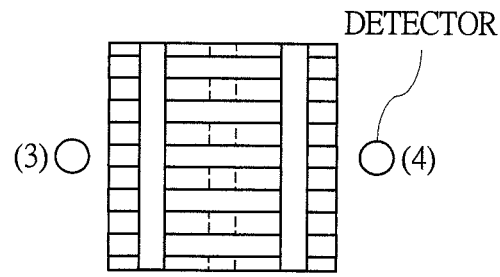
CASE OF DETERMINATION OF DETECTED IMAGE WHICH CONTAINS A LOT OF SECOND-LAYER SIGNALS BY USING FIRST LAYER
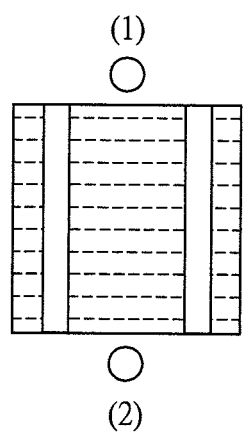

CHARGED PARTICLE BEAM DEVICE AND A METHOD OF IMPROVING IMAGE QUALITY OF THE SAME

TECHNICAL FIELD

The present invention relates to a charged particle beam device for scanning charged particles over a sample surface to acquire images, and, more particularly, the present invention relates to a method of improving image quality of the same by using detected images obtained from a plurality of detectors.

BACKGROUND ART

Among scanning electron microscopes (hereinafter, referred to as SEM) that are known as one of the charged particle beam devices in a semiconductor manufacturing process, there are a critical dimension-SEM (hereinafter, referred to as CDSEM) that is used for measuring a dimension and a shape of a fine pattern and a defect review-SEM (hereinafter, referred to as DRSEM) that is used for clearly observing a fine pattern or for detecting a defect which occurs on the pattern to specify a cause of the occurrence.

FIG. 1 illustrates a structure of an electron optical system of a general SEM. Primary electron beam that is emitted from an electron gun are converged by a convergence lens, and scanning is two-dimensionally performed on a sample by using a deflection coil. An electron beam image can be obtained by capturing reflection/secondary electrons by a detector, the electrons being generated from the sample by the electron beam irradiation. In the CDSEM, the pattern dimension is measured from the secondary electron beam image by using a magnification of the scan image which is a ratio of a (constant) scan width on an imaging display with respect to a (variable) scan width of the electron beam on the sample. On the other hand, in the DRSEM, the defect is observed by using not only the secondary electron image but also a reflection electron beam image.

Meanwhile, as illustrated in FIG. 2, for example, Patent Document 1 also suggests an electron microscope equipped with an electron optical system which uses a plurality (2 or more) of reflection electron detectors which are arranged so as to be divided around an electron beam axis. By using such a detection device, reflection electrons which are reflected into multiple directions in a wider area can be detected as compared to a case of a structure with one detector by which only the reflection electrons can be obtained in single direction. And, signals obtained from the plurality of detectors are synthesized by using the same weight coefficient, so that a good-quality reflection electron image in arbitrary direction can be easily and rapidly displayed.

PRIOR ART DOCUMENTS

Patent Documents

Patent Document 1: Japanese Patent Application Laid-Open Publication No. H01-304647

Patent Document 2: Japanese Patent Application Laid-Open Publication No. 2009-164436

Patent Document 3: Japanese Patent Application Laid-Open Publication No. H07-170395

Patent Document 4: Japanese Patent Application Laid-Open Publication No. 2009-44070

DISCLOSURE OF THE INVENTION

Problems to be Solved by the Invention

Since manufacture start of multi-layer semiconductor patterns in recent years, needs for observing a lower-layer pattern in a multi-layer capturing image have been increased. However, in the CDSEM and the DRSEM each with a usual electron optical system as described above in BACKGROUND ART, it is difficult to acquire the high-quality SEM image, more particularly, acquire an image in which the low-layer pattern in the multi-layer capturing image is clearly displayed, as accompanying miniaturization and a high aspect of the semiconductor pattern. Therefore, improvement in a contrast of the low-layer pattern in the multi-layer capturing image has been a crucial issue.

A cause of deterioration of the contrast of the low-layer pattern in the multi-layer capturing image is that a detectable electron amount of the low-layer pattern is insufficient. FIGS. 3A and 3B illustrate examples of cross-sectional diagrams of fine and high aspect multi-layer patterns (in which FIG. 3A is a case of the reflection electrons and FIG. 3B is a case of the secondary electrons). In the fine and high aspect multi-layer pattern, a lateral width of a low-layer surface is extremely narrow, and a wall surface of an upper layer in a periphery of the low-layer pattern is extremely high. When the low-layer surface is irradiated with the charged particle beam, the reflection/secondary electrons emitted from the low-layer surface hit against the wall surface of the peripheral upper layer, and cannot reach the reflection/secondary electron detector arranged on the sample (on the upper-layer surface) in the CDSEM and the DRSEM, and cannot be detected. Therefore, there is a problem of the low contrast of the low-layer pattern.

On the other hand, in the technique described in Patent Document 1, the reflection electrons in the multiple directions of the wider area can be detected by using the plurality of detectors as illustrated in FIG. 2. Therefore, it is considered that, while the reflection/secondary electrons in a certain direction cannot be detected in the above-described multi-layer semiconductor pattern, they can be detected from a different direction. FIGS. 4A and 4B illustrate examples of various detected image obtained by the plurality of the arranged detectors. While 6 detectors have been arranged in Patent Document 1, an example of arrangement of 4 detectors will be explained here for simplification. On left sides in FIGS. 4A and 4B, the multi-layer pattern and the arrangement of the plurality of detectors are illustrated. On right sides therein, the detected images obtained from the respective detectors are illustrated. In an example as illustrated in FIG. 4A in which the upper-layer pattern longitudinally extends and the low-layer pattern laterally extends, while there is little detected signal of the low-layer pattern in the detected images obtained from the detectors (3) and (4) arranged in right and left directions in the drawing, the signal of the low-layer pattern is detected in the detected images obtained from the detectors (1) and (2) arranged in upward and downward directions in the drawing. In an example as illustrated in FIG. 4B in which the upper-layer pattern laterally extends and the low-layer pattern longitudinally extends, more signals of the low-layer pattern can be detected by the detectors (3) and (4) arranged in the right and left directions. Accordingly, in order to achieve the detection of the signal of the low-layer pattern which is hardly detected in various multi layers, it is considered that the usage of the plurality of detectors is effective.

However, in Patent Document 1, in a process of synthesizing the detected signals of the plurality of detectors, synthesis weight coefficients of the detected signals of the respective detectors are of the same value, and therefore, their appropriate allocations in accordance with the pattern arrangement are not considered. In that case, as illustrated in FIG. 5, a plurality of detected signals 507 obtained from a plurality of detectors 502 are processed by a detected-image synthesis 505, and, as a result, there is a problem that the signal of the low-layer pattern in a synthesized image 506 is conversely weakened as compared to good detected images. Therefore, an issue is to improve the contrast of the low-layer pattern in the multi layer by synthesizing the detected signals from the plurality of detectors by using a ratio of the appropriate allocations in accordance with the pattern arrangement.

Accordingly, a preferred aim of the present invention is to provide a technique of improving a contrast of a low-layer pattern in a multi layer by synthesizing detected signals from a plurality of detectors by using a ratio of appropriate allocations in accordance with pattern arrangement.

The above and other preferred aims and novel characteristics of the present invention will be apparent from the description of the present specification and the accompanying drawings.

Means for Solving the Problems

A summary of the typical ones of the inventions disclosed in the present application will be briefly described as follows.

That is, the typical ones are summarized that the invention is applied to a charged particle beam device and to a method of improving image quality thereof, the charged particle beam device being capable of improving the image quality by using detected images obtained from a plurality of detectors, and a method of generating one or more output images from the detected images corresponding to outputs of the respective detectors that are arranged at different locations is controlled by using information of a pattern direction or an edge strength calculated from a design data or the detected images. In this manner, a detection area of the detected signals is expanded by using the plurality of detectors, and the detected signals are synthesized by using the pattern direction or the edge strength calculated from the design data or the detected images, so that the image quality such as the contrast can be improved. More specifically, the following features are provided.

(1) The feature is to control a method of generating the synthesized image by using an estimated value obtained by estimating the detected signal amount of the lower-layer pattern obtained from each detector by using information of the direction of the upper-layer pattern of the design data, a degree of edge continuity of the design data/detected image, or the pattern direction or the edge strength calculated from the detected image.

(2) The feature is to generate one synthesized image by dividing images depending on each layer or pattern by using a contour line of the design data or an extracted image, and synthesizing a plurality of detected images (hereinafter, referred to as "detected image set") depending on each region.

In this manner, since the images can be flexibly synthesized for each region by the division, high-performance synthesis capable of extracting more signals of the low-layer patterns can be achieved. Also, high-efficient processing can be achieved from the pattern-dependent division by using the same weight coefficient for regions or patterns whose properties are similar to each other.

(3) The feature is, in controlling generation of output images, to control a method of generating the synthesized image by using a result of determination obtained by, among the detected images, determining an image which relatively contains a lot of signals of an "N th" layer counted from a top layer of the design data or the detected images by using information of a pattern shape or a pattern direction of at least one layer among layers from the top layer to an "N−1 th" layer, in which "N" is at least one natural number of 2 or larger.

(4) The feature is to estimate a signal intensity of an image to be synthesized by using the design data or a synthesized image that has been previously generated, and determine an image-capturing condition based on the estimated signal intensity.

(5) The feature is to encourage a user to input information of the synthesis of the detected image or specification of a region whose dimension is to be measured or whose defect is to be observed, and generate the synthesized image based on information that has been specified by the user.

Effects of the Invention

The effect obtained by typical aspects of the present invention disclosed in the present application will be briefly described below.

That is, the effect obtained by the typical aspects is that the high-contrast image of the low-layer pattern in the fine and high-aspect multi-layer semiconductor pattern can be synthesized by controlling the synthesis of the detected signal in the low layer obtained from the plurality of detectors based on information of the pattern direction of the upper layer in the design data, or information of the pattern direction or the edge strength of the upper layer calculated from the detected images.

BRIEF DESCRIPTIONS OF THE DRAWINGS

FIG. 5 is a diagram illustrating synthesis by using the same weight coefficient and its effect in the SEM in Patent Document 1;

FIG. 13 is a diagram for explaining reflection principle of reflection/secondary electrons in the first embodiment of the present invention;

FIG. 14 is a diagram for explaining one example of a concept of determining an image, which relatively contains a lot of signals of a lower layer, by a detected image set by using information of a pattern shape or direction of an upper layer in a multi-layer semiconductor pattern formed of two or more layers, in the first embodiment of the present invention;

BEST MODE FOR CARRYING OUT THE INVENTION

Figure 1:
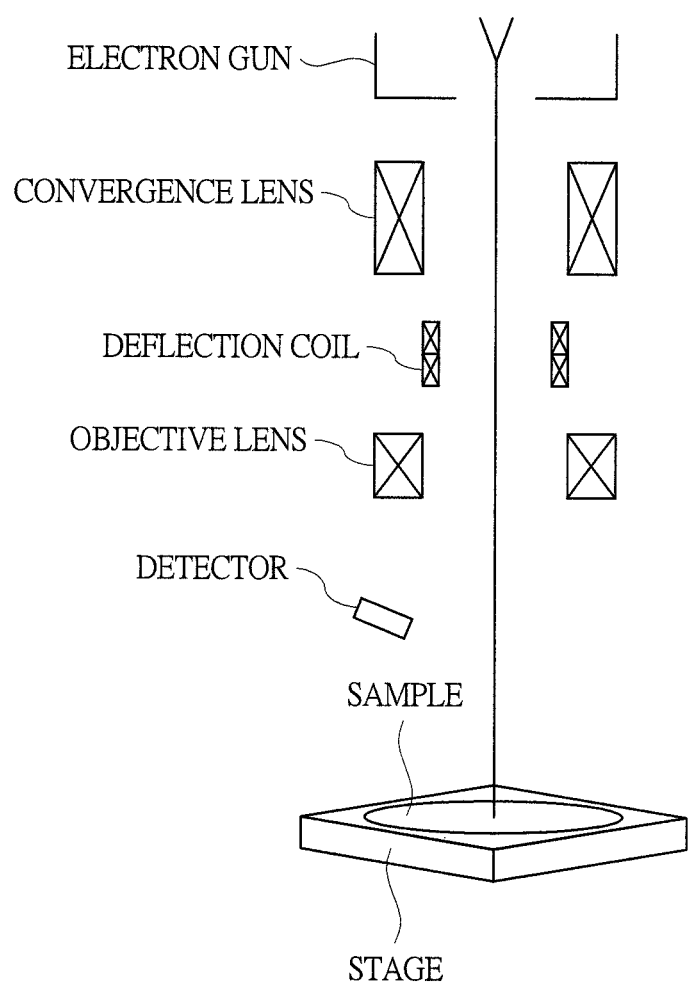
FIG. 1 is a diagram illustrating a configuration of an electron optical system of a general SEM.
Figure 2:
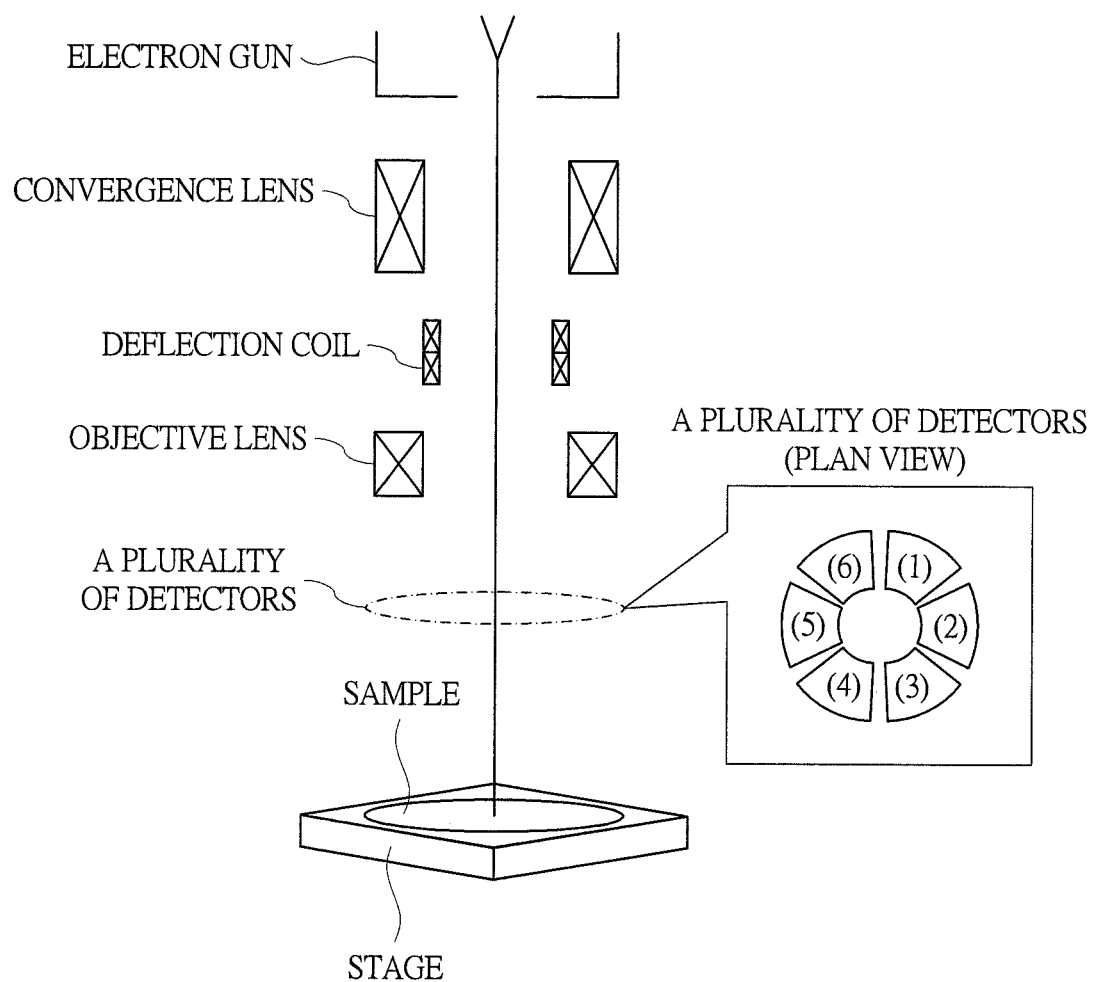
FIG. 2 is a diagram illustrating a configuration of an electron optical system of a SEM in Patent Document 1.
Figure 3A:
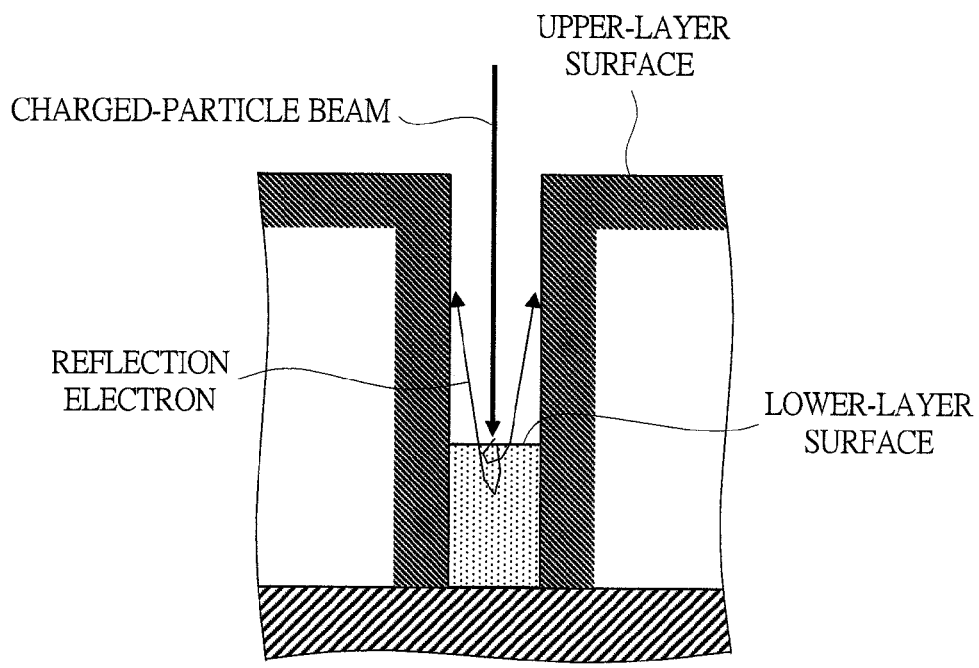
FIGS. 3A and 3B are diagrams for explaining a principle of why it is difficult to detect reflection/secondary electrons emitted from a low-layer pattern in the general SEM.
Figure 3B:
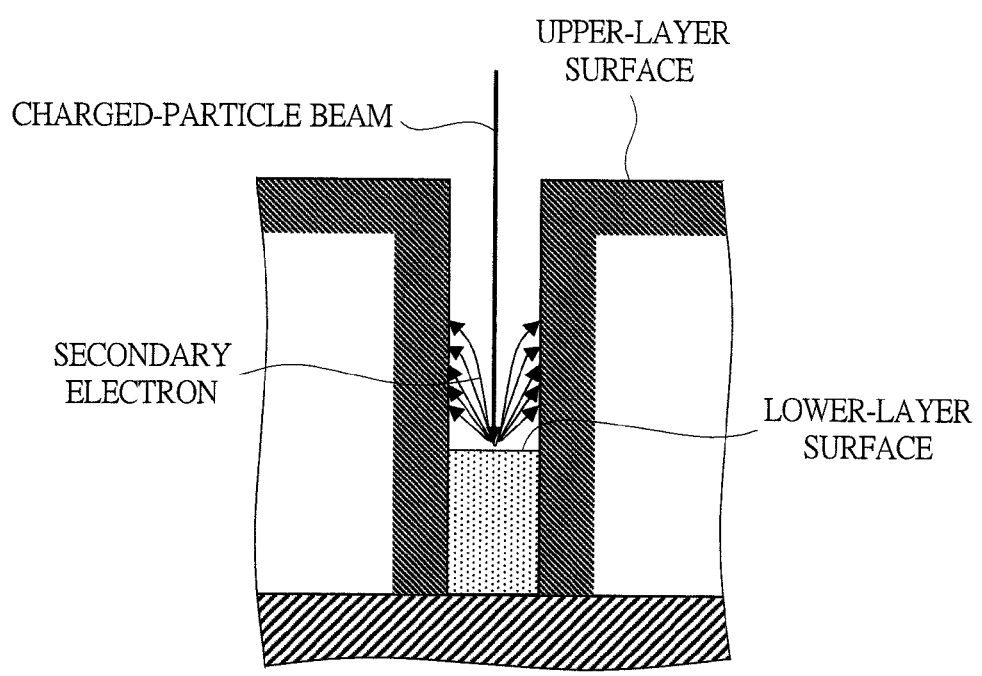
Figure 4A:
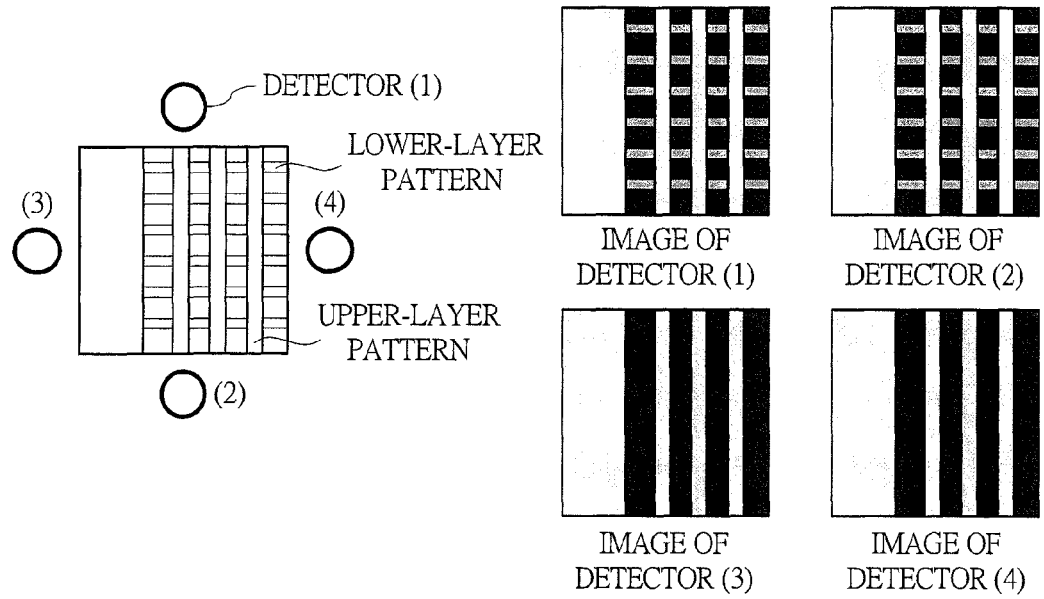
FIGS. 4A and 4B are diagrams illustrating necessity of synthesizing signals from a plurality of detectors in the SEM in Patent Document 1.
Figure 4B:
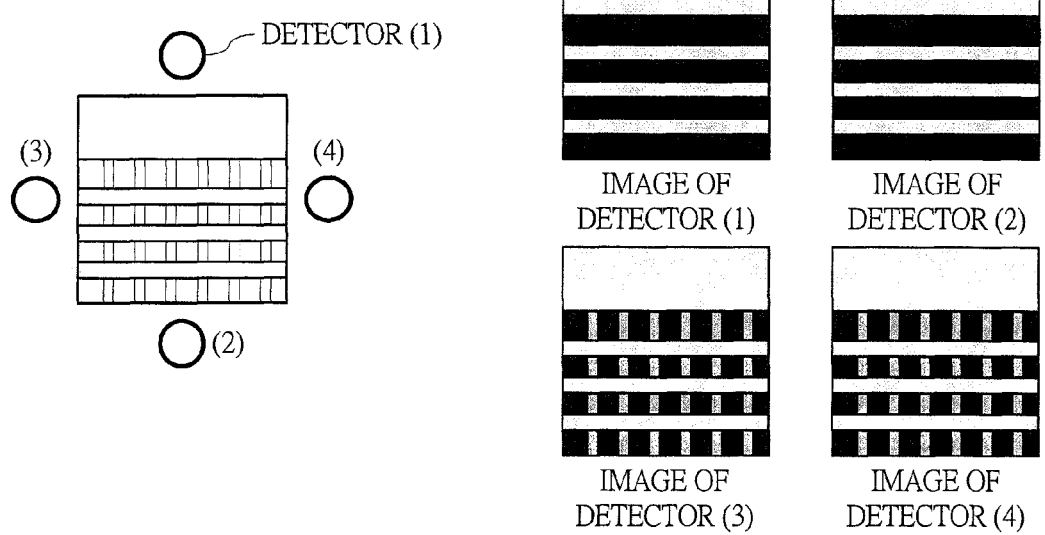

Hereinafter, embodiments of the present invention will be described in detail with reference to the accompanying drawings. Note that the same components are denoted by the same reference symbols in principle throughout the drawings for describing the embodiments, and the repetitive description thereof will be omitted.

Summary of Embodiments

In the embodiments of the present invention, a scanning electron microscope (hereinafter, referred to as "SEM") which is one of charged particle beam devices according to the present invention will be described. However, the present invention is not limited to this, and may also be a scanning ion microscope (SIM).

The present embodiments have a feature of improving a contrast of a lower-layer pattern by a device configuration in which a plurality of reflection/secondary electron detectors are arranged at different arrangement locations, and by a process of appropriately synthesizing a plurality of detected images obtained from the respective detectors by using information of a pattern direction, an edge strength, or others calculated from a design data or an image.

The design data means a data indicating information of a semiconductor pattern shape to be manufactured, in which the pattern shape is usually written with information of a contour of the semiconductor pattern. Also, the design data may contain height information of the semiconductor pattern or information of sample characteristics such as material characteristics, electrical characteristics, and layer characteristics.

In the SEM described below, terms handled in the charged particle beam device may be referred to as follows. A charged particle gun for irradiating charged particle beam (electron beam) is referred to as an electron gun, a lens for converging the charged particle beam is referred to as a condenser lens or others, and a scanning device for scanning the converged charged particle beam over a sample that is an object to be image-captured is referred to as a deflector or others. Further, a detected-image generator for generating detected images corresponding to outputs of 2 or more detectors is referred to as an image generating unit, an output-image generation controller for controlling a method of generating one or more output images by using the detected image by using information of a pattern direction or an edge strength calculated from a design data or the detected image is referred to as a design-data processing unit, a synthesis-method controlling unit, or others, and an output-image generator for generating one or more output images by using the detected image in accordance with a method of generating the output image which is determined by the design-data processing unit, the synthesis-method controlling unit, or others is referred to as a synthesizing unit or others. Also, the design-data processing unit, the synthesis-method controlling unit, the synthesizing unit, and others are collectively referred to as a signal synthesizing unit.

In the above-described method of improving the image quality of the SEM, a step of charged particle beam irradiation is executed with using the electron gun by irradiating the converged charged particle beam over a sample that is an object to be image-captured to scan the sample, a design-data reading step is executed with using the design-data processing unit by reading a design data corresponding to a position of the sample on which the charged particle beam has been irradiated, and a detected-image generating step is executed with using the image generating unit by detecting secondary charged particles or reflection charged particles that have been generated from the sample by the charged particle beam by using two or more detectors that are arranged at different arrangement locations to generate the detected image corresponding to the output of each detector. And, an output-image generation controlling step is executed with using the synthesis-method controlling unit or others by controlling the method of generating one or more output images from the detected image by using information of a pattern direction or an edge strength calculated from the design data or the detected image, and an output-image generating step is executed with using the synthesizing unit or others by generating one or more output images from the detected image in accordance with the method of generating the output images determined in the output-image generation controlling step.

Hereinafter, each embodiment based on the above-described summary of embodiments will be explained in details with reference to the drawings.

First Embodiment

A first embodiment of the present invention will be explained with reference to FIGS. 6 to 19 and 25.

Figure 6:
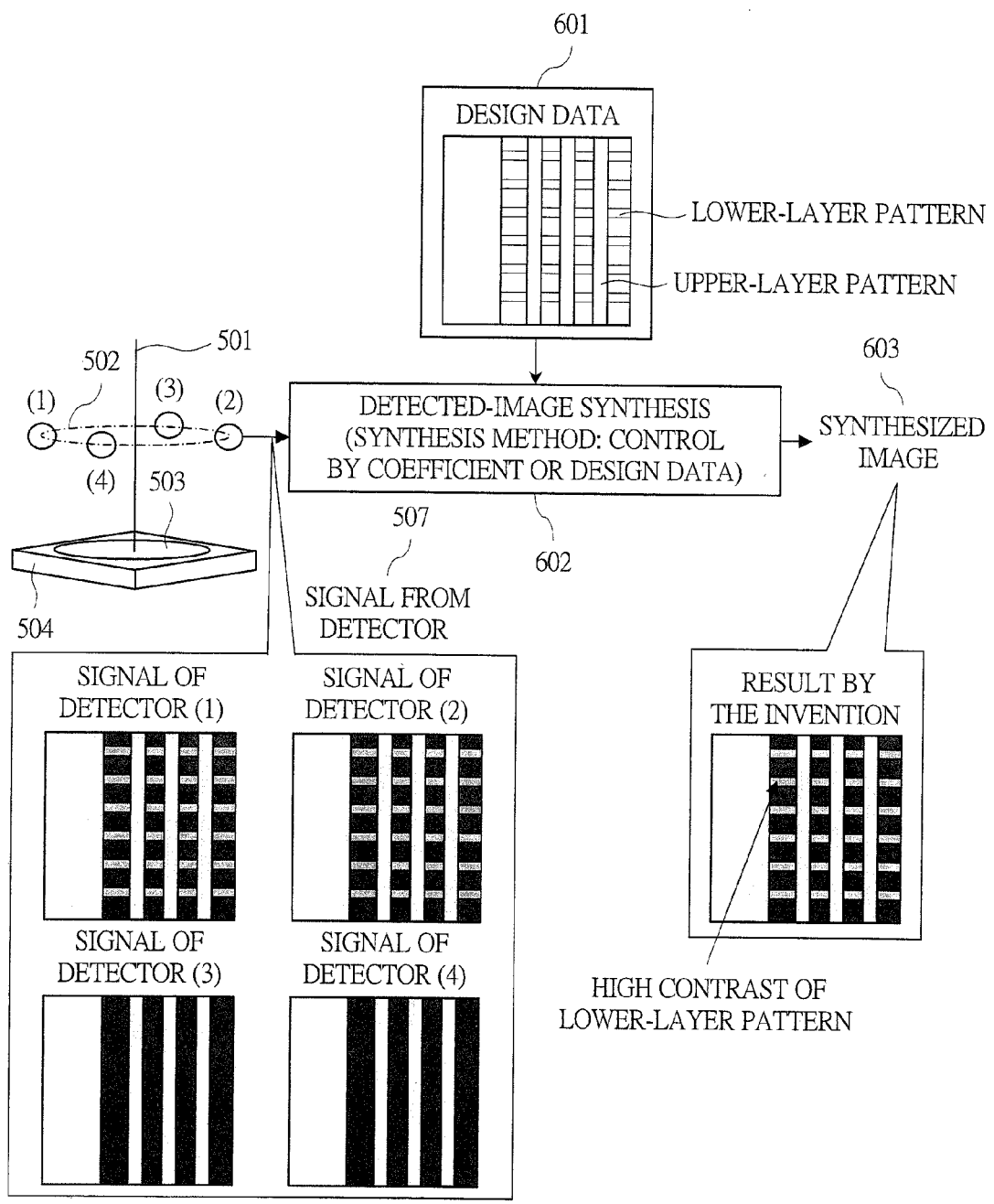
FIG. 6 is a diagram illustrating one example of synthesis by using signals from a plurality of detectors by using a design data and its effect in a first embodiment of the present invention.

FIG. 6 is a diagram illustrating one example of synthesis by using signals from a plurality of detectors by using a design data and its effect in the present embodiment. While the present embodiment describes an example that the plurality of detectors are arranged so as to be divided around an axis of the electron beam similarly to the arrangement of Patent Document 1, the present invention is not limited to this. In this embodiment, a synthesized image 603 with a high-contrast lower-layer pattern is obtained by performing a detected-image synthesis 602 by using a synthesis-method/control parameter obtained by using a design data 601 to detected signals 507 obtained from a plurality of detectors 205 which are for detecting the reflection/secondary electrons that have been emitted when a sample 503 mounted onto a stage 504 is scanned by a charged particle beam 501.

Hereinafter, explanations will be sequentially made about [1] a configuration of an inspection device by using a SEM, [2] a flow of the synthesis by using the design data, [3] an application method in a case that a synthesis processing by using the detected signals from the plurality of detectors is applied to the pattern dimension measurement in a CDSEM, [4] a GUI used in the case of the application to the pattern dimension measurement in the CDSEM, and [5] a method of controlling the image-capturing condition.

First, [1] a structure of an inspection device by using a SEM will be explained.

Figure 7:
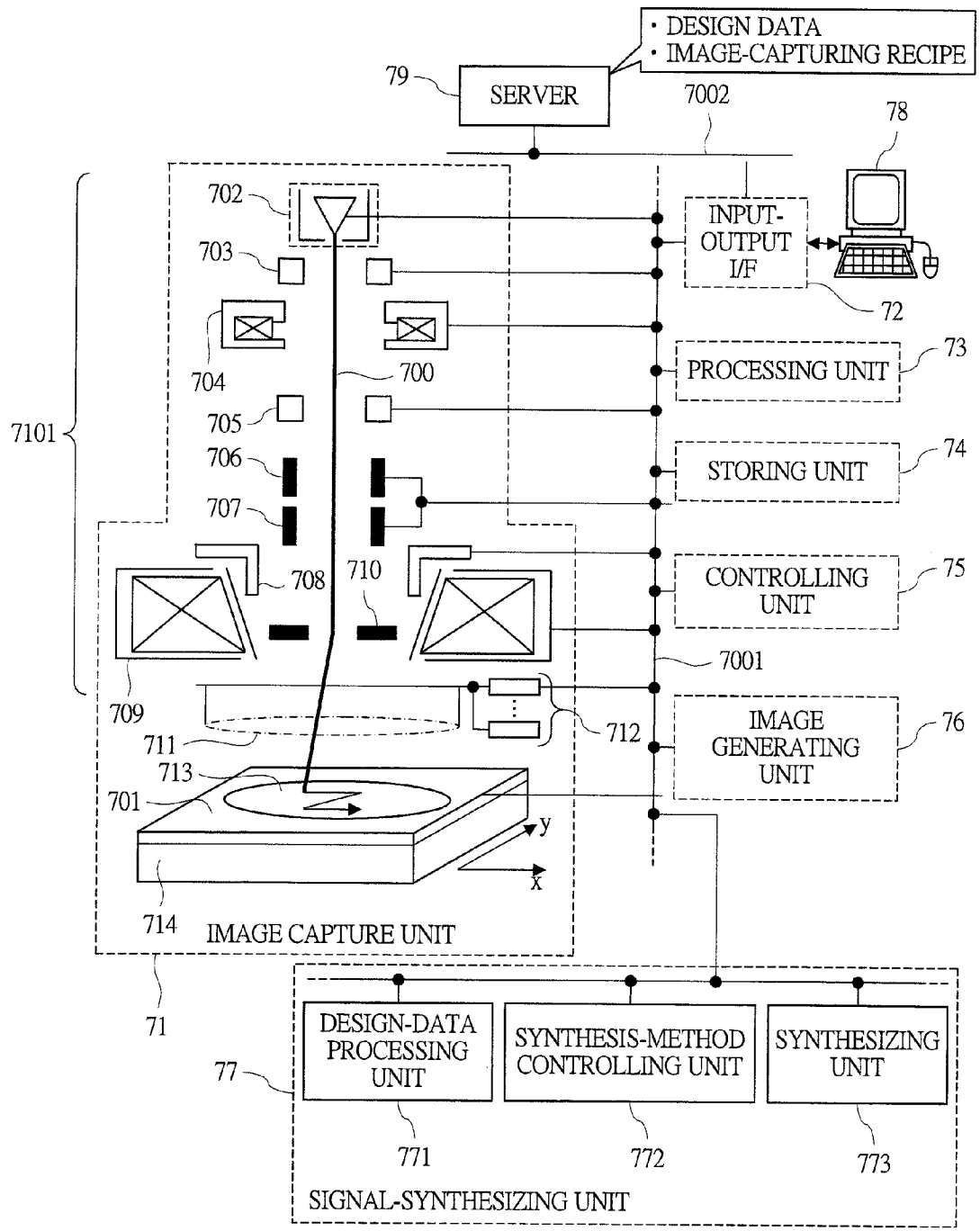
FIG. 7 is a schematic configuration diagram illustrating one example of an entire configuration of an inspection device by using SEM for acquiring and synthesizing a plurality of detected images illustrated in FIG. 6 in the first embodiment of the present invention.

FIG. 7 is a schematic configuration diagram illustrating one example of an entire configuration of an inspection device by using a SEM for acquiring and synthesizing a plurality of detected images illustrated in FIG. 6 in the present embodiment. As illustrated in the drawing, the inspection device by using the SEM is configured of: an image-capturing unit 71 including an electron optical system 7101 for acquiring SEM images; an input-output I/F 72 for inputting/outputting data from/to an external device; a processing unit 73 for performing various processes; a storing unit 74 for storing various data; a controlling unit 75 for controlling the above-described respective units; an image-generating unit 76 for generating images from signals from the image-capturing unit 71; a signal-synthesizing unit 77 for outputting signals from the plurality of detectors as one piece of image data; an input-output terminal 78 such as a display/keyboard; and a server 79 for saving external data or others. The external data is a content of the design data, an image-capture recipe, or others. The respective units 71 to 77 are connected by a control bus 7001. The input-output terminal 78 is connected to the input-output I/F 72, and the user can give instructions to the device via the input-output terminal 78, and can confirm a state of the device. The server 79 is connected to the device via a network 7002.

The electron optical system 7101 of the image-capturing unit 71 is configured of: an electron gun 702; an alignment coil 703 that aligns emission of the primary electron beam 700 that is emitted from the electron gun 702; a condenser lens 704 for converging the primary electron beam 700; an astigmatism correction coil 705 for correcting astigmatism of the primary electron beam 700; deflectors 706 and 707 for two-dimensionally deflecting the primary electron beam 700 and generating a deflected primary electron beam 701; a boosting electrode 708; an objective lens 709; an objective lens aperture 710; a plurality of reflection/secondary electron detectors 711 for detecting reflection/secondary electrons generated from a sample 713 irradiated with the deflected primary electron beam 701; and others. In this drawing, the plurality of detectors 711 are arranged at a plurality of locations in vicinity of the sample 713 that is scanned with the electron beam and around the axis of the corresponding electron beam, and they may be arranged on the same horizontal line and also at different height positions.

The sample 713 such as a wafer is placed on an XY stage 714, and is traveled by the XY stage 714, so that signals are detected at an arbitrary position on the sample 713 for generating images. The signals obtained by detecting the reflection/secondary electrons generated from the sample 713 by the plurality of detectors 711 are converted into digital signals by an A/D converter 712 to generate digital images (hereinafter, referred to as "images") by the image-generating unit 76. All of the plurality of detectors 711 may be secondary electron detectors, reflection electron detectors, or a combination of reflection/secondary electron detectors.

By the input-output I/F 72, the design data is inputted, the detected image or the synthesized image is outputted, and the synthesis method or the synthesis control parameter (for example, the synthesis weight coefficient) is outputted, and so on. The processing unit 73 transfers the data or others. The storing unit 74 temporarily saves a previously-acquired data. The controlling unit 75 controls a voltage applied to the alignment coil 703, the astigmatism correction coil 705, and the boosting electrode 708, which are arranged in the periphery of the electron gun 702 of the electron optical system 7101 in the image-capturing unit 71, controls adjustment of a focus position of the electron lenses for convergence (for example, the condenser lens 704 or the objective lens 709), controls a position of the XY stage 714, controls an operation timing of the A/D converter 712, and controls generation of the detected image in the image-generating unit 76, and so on.

Also, the signal-synthesizing unit 77 is configured of: a design-data processing unit 771; a synthesis-method controlling unit 772; a synthesizing unit 773; and others. The design data is read from the server 79 in the input-output I/F 72, and then, processing for deformation of the design data, alignment, or others is performed in the design-data processing unit 77. Then, the synthesis method is determined to be either linear one or non-linear one in the synthesis-method controlling unit 772, so that a corresponding synthesis control parameter is calculated. Lastly, the synthesis is performed in the synthesizing unit 773 by using the synthesis method and the synthesis control parameter, so that one image with high image quality which is obtained by improving the contrast of the lower-layer pattern or others is generated from the acquired plurality of detected images.

Next, [2] the flow of the synthesis by using the design data will be explained.

Figure 8:
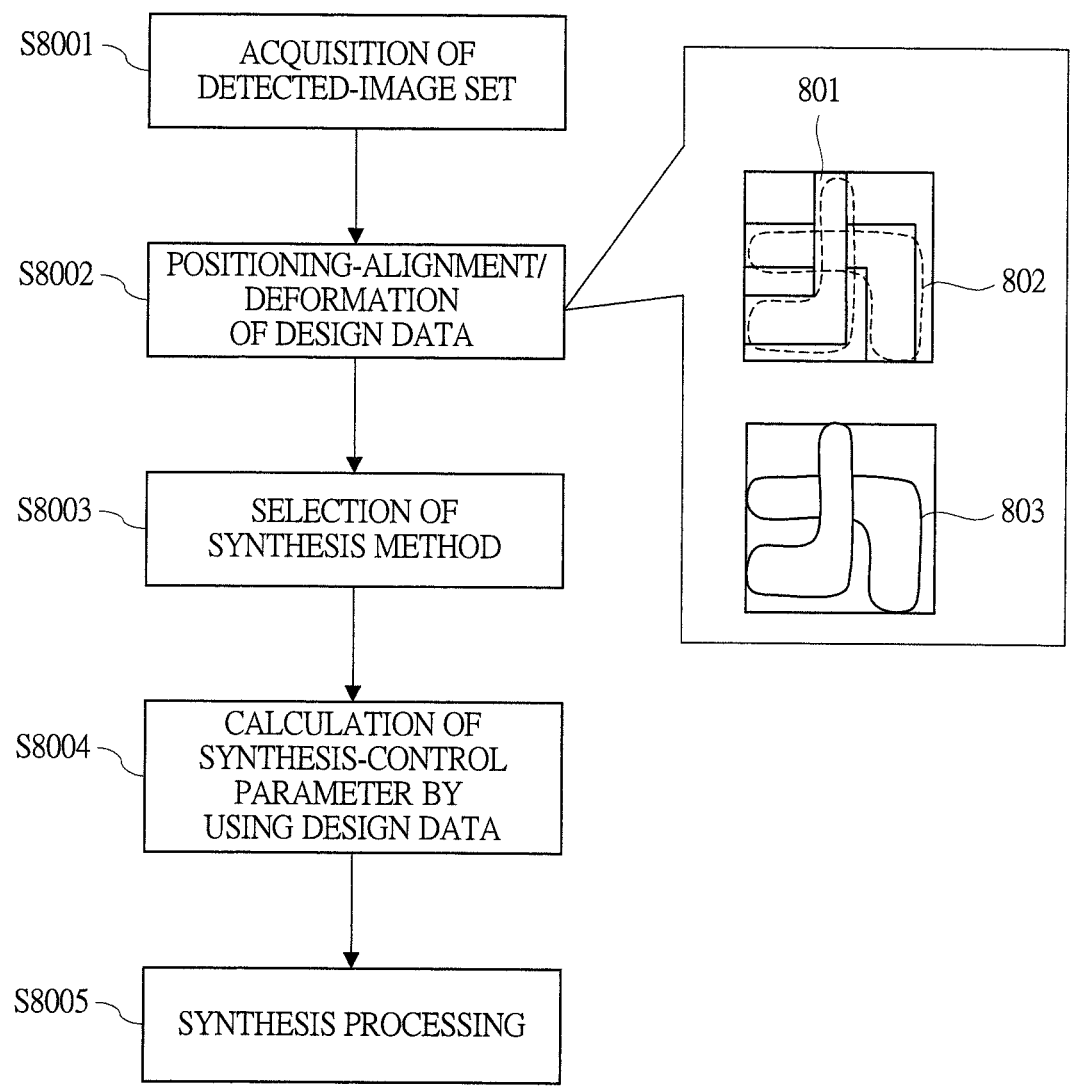
FIG. 8 is a diagram illustrating one example of a process flow of synthesis by using a design data in the first embodiment of the present invention.

The flow of the synthesis of the detected images (hereinafter, referred to as "detected-image set") which are obtained from the plurality of detectors by using the design data will be explained with reference to FIG. 8. FIG. 8 is a diagram illustrating one example of a process flow of the synthesis by using the design data.

First, the detected-image set that has been converted by the A/D converter 712 and that is temporarily saved in the storing unit is acquired (S8001), and a preprocessing such as the positioning-alignment/deformation of the design data is performed (S8002). Along with formation of a semiconductor pattern on the wafer, positional shift or deformation is caused between the design data 801 and an actual pattern 802 prior to the deformation as illustrated in FIG. 8. Therefore, in the processing by using the design data, it is required to perform a processing for correcting the positional shift or for deforming the pattern so as to be close to a circuit pattern shape. After completion of the positioning-alignment/deformation processing, the deformed design data 803 has a similar shape to the actual pattern 802 so as to completely overlap with each other. For the positioning-alignment/deformation processing, a method disclosed in Japanese Patent Application Laid-Open No. 2009-164436 (Patent Document 2) is used to estimate difference between the design data and the actual captured image, and deform and align the design data so as to come closer to the shape and the position of the actual captured image pattern.

Next, the synthesis method is selected (S8003). The synthesis method may be the linear synthesis method, the non-linear synthesis method, or even a combined method of the linear one and the non-linear one. And, the synthesis control parameter is calculated by using the processed design data (S8004), and then, the synthesis processing is performed (S8005).

The synthesis control parameter is a generic term of parameters used in the synthesis method. For example, the weight coefficient for the linear synthesis method is one of the synthesis control parameters.

Next, explanations will be sequentially made about (1) how to select the synthesis method, (2) a method of calculating the synthesis control parameter, and (3) a method of calculating a synthesis index value for changing the synthesis method and the synthesis control parameter depending on the locations.

(1) How to Select Synthesis Method

As described above, the synthesis method may be the linear synthesis method or the non-linear synthesis method. As for the linear synthesis method, for example, while a general method as shown in "Equation 1" may be used, the method is not limited to this. In Equation 1, the detected image set is represented by "$x_i$" (i=1, 2, 3, ... n), the synthesized image is represented by "y", and the synthesis control parameter (linear synthesis weight coefficient) is represented by "$\alpha_i$".

$$y = \Sigma \alpha_i x_i \quad \text{(Equation 1)}$$

As for the non-linear synthesis method, for example, while a method as shown in "Equation 2" may be used, the method is not limited to this. In the equation, "$f(x_i)$" is a non-linear function in which a brightness level of the detected image to be inputted is controlled by a degree of amplitude which differs depending on the level.

$$y = \Sigma \alpha_i f(x_i) \quad \text{(Equation 2)}$$

For example, the non-linear function $f(x_i)$ may be a polynomial, a sigmoid function, or others. A purpose for using the non-linear function is to control the brightness level of the input detected image by the degree of amplitude which differs depending on the level. In this manner, amplification of a noise component concentrated in a region whose brightness level is low can be prevented, and saturation of the upper-layer pattern whose brightness level is high can be prevented.

Also, both of the weight coefficients $\alpha_i$ of Equation 1 and Equation 2 satisfy a relation of "$\Sigma \alpha_i = 1$".

The synthesis-method selection (S8003) processing is a processing of selecting either the linear synthesis method or the non-linear synthesis method to be used. In this processing, for each detected-image set, the synthesis methods are switched by using average or dispersion of brightness values in the lower-layer pattern. However, the processing is not limited to this.

(2) Method of Calculating Synthesis Control Parameter (2-1) Method of Calculating Weight Coefficient "$\alpha_i$"

As specific control of the synthesis method, three methods will be explained, which are (2-1-1) a method by using the pattern direction of the design data, (2-1-2) a method by using the degree of edge continuity of the design data/the detected image, and (2-1-3) a method by using the pattern height information of the design data.

(2-1-1) Method by Using Pattern Direction of Design Data

In one example of the method of calculating the weight coefficient $\alpha_i$ by using the pattern direction of the design data, first, the pattern direction is calculated by using the deformed design data 803 from layout information of the design data. Since the design data is a line form, directional filters in several certain directions may be used in order to obtain the pattern direction of the design data. Next, it is judged whether or not the upper-layer pattern exists in a direction from each lower-layer pattern to a portion where the detector is arranged, and then, a small weight coefficient may be provided to the detected image generated from the detector which is arranged in the direction with the existence of the upper-layer pattern, and a large weight coefficient may be provided to the detected image generated from the detector which is arranged in the direction without the existence of the upper-layer pattern.

Figure 9A:
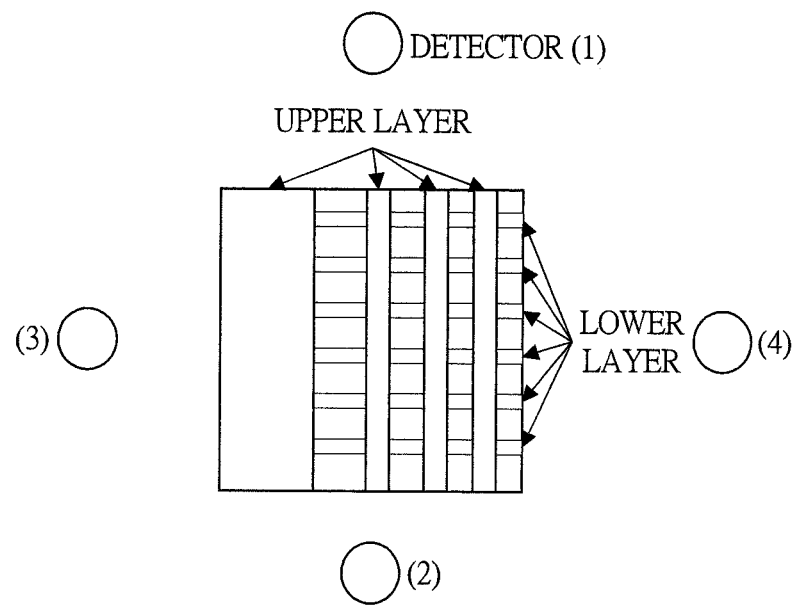
FIGS. 9A and 9B are diagrams illustrating one example of calculating a weight coefficient by using a pattern direction in a design data in the first embodiment of the present invention.
Figure 9B:
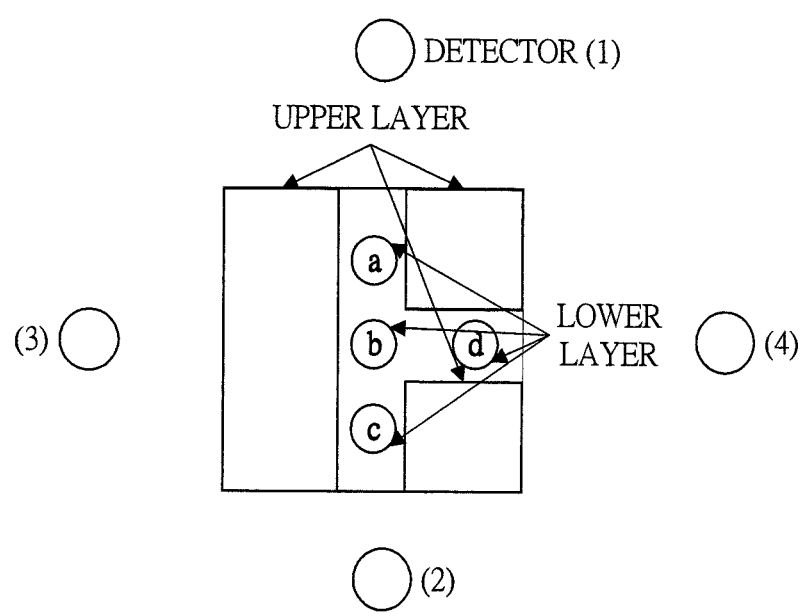

As a specific example, FIGS. 9A and 9B illustrate one example of calculating the weight coefficient by using the pattern direction of the design data. In the design data illustrated in FIG. 9A, the upper-layer line pattern extends in a longitudinal direction in the drawing, and therefore, the charged particles that have been emitted from the lower-layer pattern are blocked in a lateral direction therein. However, the charged particles that have been emitted from the lower-layer pattern are not blocked in the longitudinal direction. Therefore, when it is assumed that the allocation ratios of the synthesis coefficients of the detectors "1", "2", "3" and "4" are "$\alpha_1$", "$\alpha_2$", "$\alpha_3$", and "$\alpha_4$", respectively, it is set that, for example, "$\alpha_1 = \frac{1}{2}$", "$\alpha_2 = \frac{1}{2}$", "$\alpha_3 = 0$", and "$\alpha_4 = 0$". On the other hand, in the design data illustrated in FIG. 9B, among the lower-layer patterns "a", "b", "c" and "d", the upper-layer pattern does not exist in the longitudinal direction of "a" and "c", and the upper-layer pattern exists in the lateral direction. Therefore, the synthesis weight coefficient is set for the lower-layer patterns such as "$\alpha_{1(a,c)} = \alpha_{2(a,c)} = \frac{1}{2}$", "$\alpha_{3(a,c)} = \alpha_{4(a,c)} = 0$", "$\alpha_{1(b)} = \alpha_{2(b)} = \alpha_{4(b)} = \frac{1}{3}$", "$\alpha_{3(b)} = 0$", "$\alpha_{1(d)} = \alpha_{2(d)} = \alpha_{3(d)} = 0$" and "$\alpha_{4(d)} = 1$".

(2-1-2) Method by Using Degree of Edge Continuity of Design Data and Detected Image Next, one example of a method of calculating a weight coefficient $\alpha_i$ by using a degree of edge continuity of the design data/the detected image will be explained. In this example, first, edge of an inspection-object circuit pattern image of the detected image set (hereinafter, referred to as "detected edge image") is extracted. The edge extraction is performed by applying an edge extraction filter or others to enhance contour of a SEM image for performing binarization process or thinning process as described in Japanese Patent Application Laid-Open Publication No. H07-170395 (Patent Document 3). Next, the degree of continuity of the lower-layer pattern of each detected edge image in the pattern edge is calculated based on the deformed design data as a reference, so that the synthesis weight coefficient of each detector signal is calculated.

Figure 10:
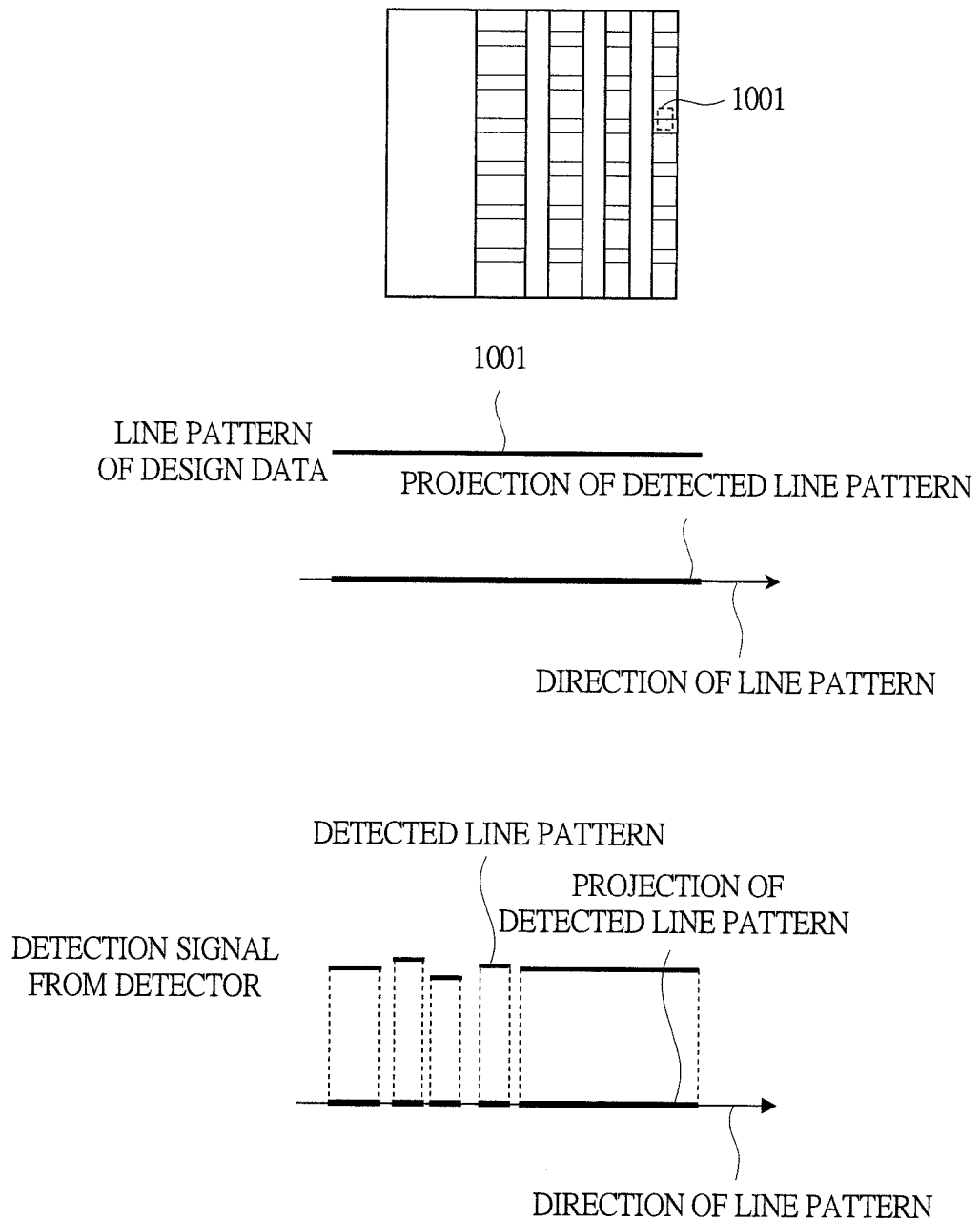
FIG. 10 is a diagram illustrating one example of calculating the weight coefficient by using a degree of edge continuity of the design data and the detected image in the first embodiment of the present invention.

The degree of edge continuity "$q_i$" (i: detector number) is an index value which indicates the edge continuity. For example, FIG. 10 illustrates one example of calculating the weight coefficient by using the degree of edge continuity of the design data and the detected image. As illustrated in FIG. 10, a line pattern 1001 of the design data for which projection of a detected line-pattern signal in a line pattern direction is used as a reference may be defined by a ratio with respect to the projection in the line pattern direction. However, the present invention is not limited to this. In this example, the degree of continuity of each detected image is calculated by using all edge components in each detected edge image. Further, the calculation of the synthesis weight coefficient from the degree of continuity of each detected image is set so as to satisfy, for example, a relation of "$\alpha_i = q_i / \Sigma q_i$". In this manner, the synthesis can be performed without damaging the detected signal, and noise reduction can be also achieved.

(2-1-3) Method by Using Pattern Height Information of Design Data

Figure 11:
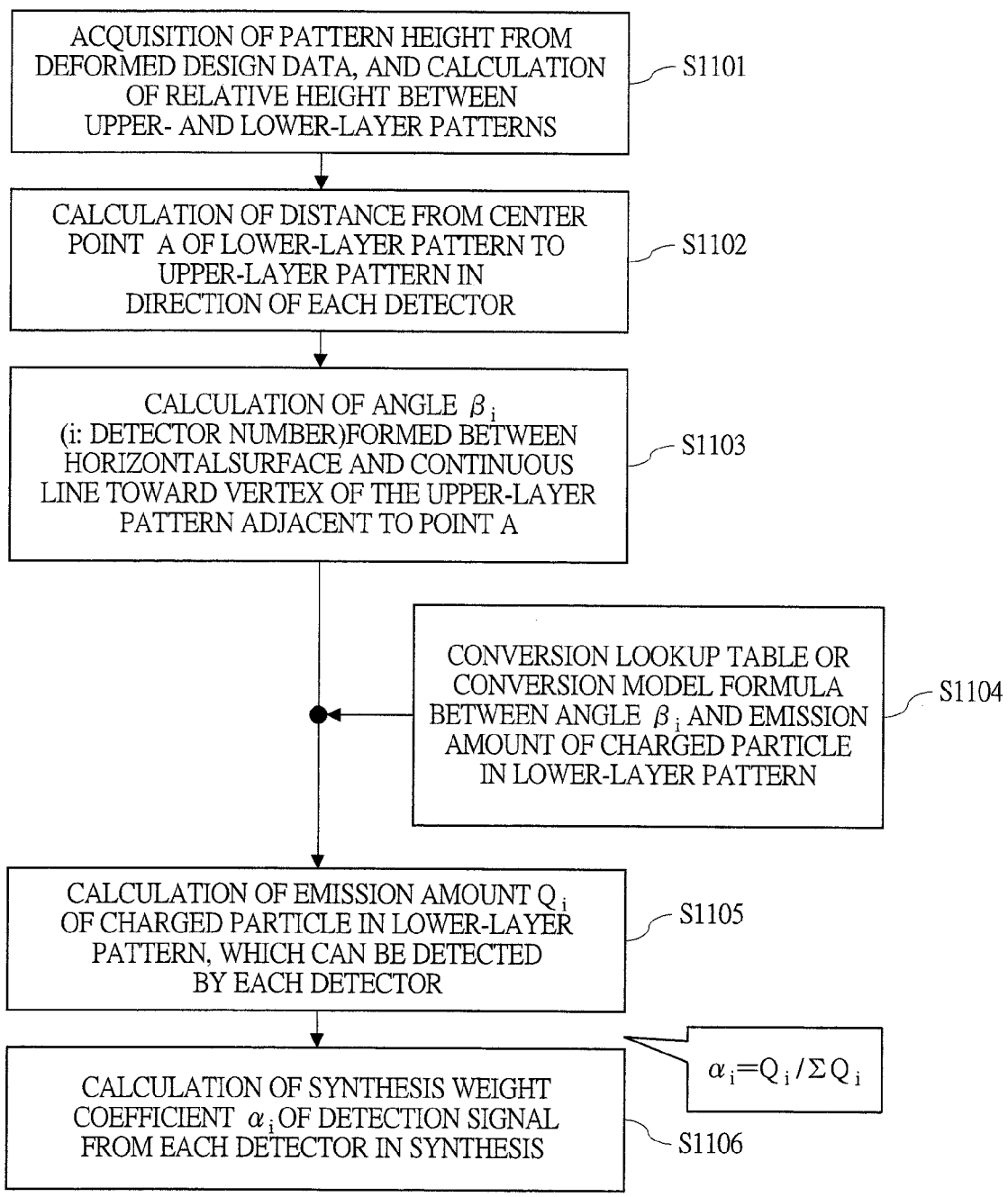
FIG. 11 is a diagram illustrating one example of calculating the weight coefficient by using pattern height information of the design data in the first embodiment of the present invention.
Figure 12A:
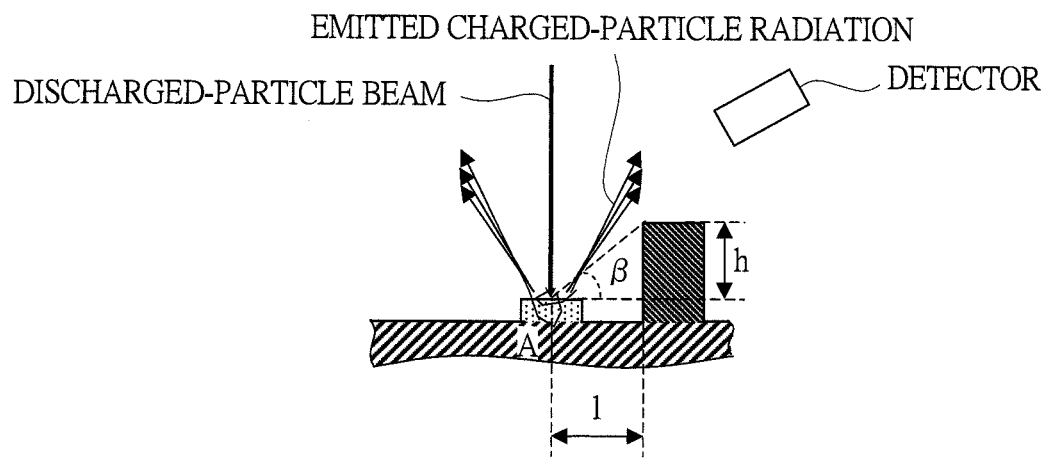
FIGS. 12A to 12C are diagrams illustrating a concept of the calculation of the weight coefficient by using the pattern height information of the design data in the first embodiment of the present invention.
Figure 12B:
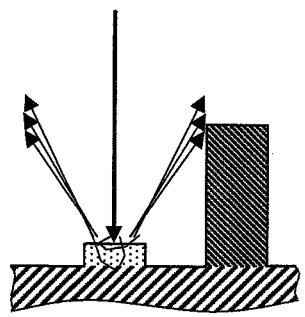
Figure 12C:
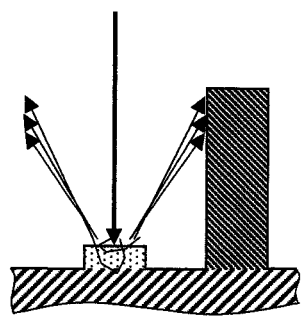

FIG. 11 illustrates one example of calculating the weight coefficient by using the pattern height information of the design data. When the pattern height information of the design data exists, the weight coefficient $\alpha_i$ can be calculated by using this pattern height information of the design data. A concept of this weight-coefficient calculation by using the pattern height information of the design data is illustrated in FIG. 12. In this example, the pattern height information is acquired from the deformed design data, and a relative height "h" between the upper- and lower-layer patterns is calculated (S1101), and then, when it is assumed that a center point of the lower-layer pattern is an incident point "A" of the charged particle beam, a distance "l" from the point "A" to the upper-layer pattern existing in the direction of each detector is calculated (S1102). And, by using the "h" and the "l", an angle "β" formed between a horizontal surface and a continuous line toward vertex of the upper-layer pattern adjacent to the lower-layer pattern as illustrated in the drawing is calculated (S1103). A conversion lookup table or model formula representing a conversion relationship is previously obtained through an experiment or simulation (S1104), the table or the formula representing a relationship between the angle β and an emission amount of the charged particles emitted from the incident point A at which the upper-layer pattern can be detected. And, the emission amount "Q" of the charged particles from the lower-layer pattern which can be detected by each detector is calculated from the angle β by using the conversion lookup table or the model formula (S1105), and the synthesis weight coefficient α of the detected signal from each detector is automatically calculated from the emission amount of the charged particles (S1106). When the emission amount of the charged particles obtained from each detector (i: detector number) is represented by "$Q_i$", the weight coefficient is set so as to satisfy, for example, a condition of "$\alpha_i = Q_i / \Sigma Q_i$". In this manner, the synthesis without damaging the detected signal can be achieved, and noise reduction can be also achieved.

Also, in addition to the above-described calculation, a processing such as edge enhancement with respect to the edge of the lower-layer pattern may be performed.

FIG. 13 illustrates characteristics of the emitted charged particles at the edge for explaining the reflection principle of the reflection/secondary electrons. If the detected particles are charged particles having strong energy such as the reflection electrons, they exhibit characteristics as illustrated in (a-1) to (a-3) in FIG. 13. That is, when both ends of the pattern have slope, the reflection electrons proceed in a direction of a smaller angle from a perpendicular direction of the slope than a certain range. Therefore, in this case, if the detectors are arranged on both sides of the edge in the perpendicular direction in the lower-layer pattern, a larger weighting is provided to the detected signal that has been obtained from the detector arranged in the direction of which the slope connected to the edge faces. If the detected particles are charged particles having weak energy such as the secondary electrons, they exhibit characteristics as illustrated in (b-1) to (b-3) in FIG. 13. That is, the secondary electrons are pulled up by a voltage applied onto an upper side of the sample and are detected by the detector, and therefore, the detected signals that have been obtained by the detectors in both directions of the perpendicular direction of the edge in the lower-layer pattern are substantially equivalent to each other. Therefore, the same weighting is provided to the detected signals that have been obtained by these detectors. Further, in the case of the secondary electrons, as illustrated in the drawing, more secondary electrons are emitted at the edge than at a flat portion, and therefore, edge effects are exhibited. This characteristic may be used to perform a signal-amplification processing for the edge portion.

Also, one example of how to obtain the weight coefficient $\alpha_i$ which is the synthesis control parameter by using the design data has been described above. However, the weight coefficient $\alpha_i$ which is the synthesis control parameter may be obtained not by using the design data but by using the information of the pattern direction or the edge strength calculated from the detected image. This example will be described in a second embodiment later in detail.

Next, an explanation is made for an example of controlling a method of generating images by using a result of determination obtained by determining an image containing relatively more signals of the lowermost layer from a detected-image set by using information of a pattern shape or direction of an upper layer in a multi-layer semiconductor pattern formed of two or more layers.

FIG. 14 is a diagram for explaining one example of a concept for determining the image containing relatively more signals of the lower layer. A synthesis control parameter for controlling the method of generating images can be calculated by using a result of determination obtained by determining the image containing relatively more signals of the lower layer from the detected-image set by using the information of the pattern shape or direction of the upper layer of the multi-layer semiconductor pattern formed of two or more layers.

Here, an example of a three-layer design data with at least one natural number "N" which is 2 or larger is described. FIG. 14 illustrates a case that a detected image containing a lot of signals of a third layer is determined by using first and second layers, and a case that a detected image containing a lot of signals of the second layer is determined by using the first layer of the same design data. In each of the cases, the determined layer is illustrated by a dotted line.

In the case of determining the detected image containing a lot of signals of the third layer by using the first and second layers, an amount of the detected signals of the third layer which have been obtained by the detectors arranged in the upward and downward directions in the drawing is small since pattern intervals of the second layer are dense, while the amount of the detected signals that have been obtained by the detectors (3) and (4) arranged in the right and left directions in the drawing is large since pattern intervals of the first layer are isolated. Therefore, a large weighting is provided to the third-layer region of the detected images from the detectors (3) and (4), and a small weighting is provided to the third-layer region of the detected images from the detectors (1) and (2). In the case of determining the detected image containing a lot of signals of the second layer by using the first layer, the amount of the detected signal from the detectors (1) and (2) arranged in the upward and downward directions in the drawing is large since the circuit pattern of the first layer is formed in the longitudinal direction. Therefore, a large weighting is provided to the second-layer region of the detected images from the detectors (1) and (2), and a small weighting is provided to the second-layer region of the detected images from the detectors (3) and (4).

(3) Method of Calculating Synthesis Index Value for Changing Synthesis Method and Synthesis Control Parameter Depending on Portion The above-described synthesis method and synthesis control parameter may be dynamically changed depending on a portion. In this case, a synthesis selecting index value for changing the synthesis method or the synthesis control parameter depending on the portion may be calculated by using the pattern information of the design data.

Figure 25:
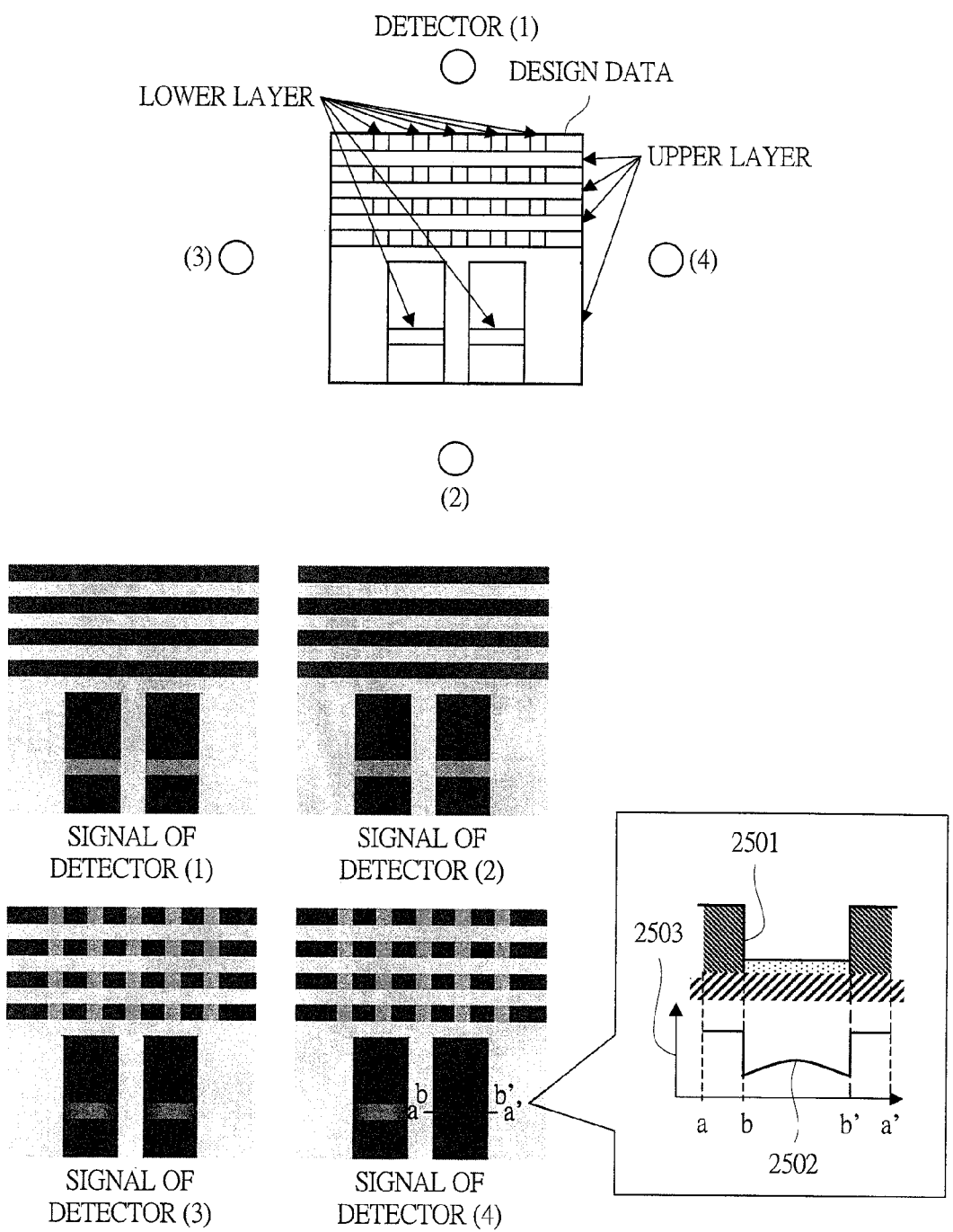
FIG. 25 is a diagram illustrating one example related to selecting synthesis methods by locations using design data in the first embodiment of the present invention.

FIG. 25 illustrates one example of selecting the synthesis method depending on the portion by using the design data. The illustrated example is an example that the lower-layer patterns are not a single pattern but a mixture pattern of a longitudinal line pattern and a lateral line pattern. Also, upper-layer lateral line patterns extend densely in periphery of lower-layer longitudinal line patterns, and very-isolated upper-layer longitudinal line patterns extend in periphery of lower-layer lateral line pattern. In the case that the upper-layer lateral line patterns extend densely in periphery of the lower-layer longitudinal line patterns, the upper-layer lateral line patterns block the lower-layer patterns in the upward and downward direction in the drawing because the upper-layer lateral line patterns are dense, and therefore, the lower-layer longitudinal line patterns are detected by only the detectors (3) and (4). On the other hand, in the case that the very-isolated upper-layer longitudinal line patterns extend in periphery of the lower-layer lateral line pattern, the upper-layer longitudinal line patterns exist in periphery of the lower-layer lateral line pattern, that is, in the right and left directions in the drawing, and the upper-layer lateral line pattern exists in the upward direction in the drawing. Therefore, the lower-layer signal can be detected by not only the detector (2) but also the detector (1) since the upper-layer lateral line pattern is significantly away from the lower-layer lateral line pattern toward the upward direction in the drawing. Also, since the upper-layer longitudinal line patterns are also extremely away, signal distribution 2502 of a cross section a-a' illustrated as 2501 can be obtained from the detectors (3) and (4). A vertical axis indicates signal intensity 2503. While there is little signal detected at b and b' in the signal distribution 2502, signals can be detected more and more as closer to the center. In such a multi-layer semiconductor pattern, it is preferred that linear combination is applied for the lower-layer longitudinal line pattern, and non-linear combination is applied for the lower-layer lateral line pattern. However, the present invention is not limited to this.

Also, regarding the case of changing the synthesis control parameter depending on the portion, there is an example of changing the synthesis control parameter depending on each layer. In this example, for example, the synthesis weight coefficient for the lower-layer pattern is obtained by the above-described method by using the design data, and the same value is used as the synthesis weight coefficient for the upper-layer pattern. However, the present invention is not limited to this.

By changing the synthesis method and the synthesis control parameter so as to consider the pattern arrangement depending on the portion, good synthesis effects can be obtained even in all portions of the lower-layer patterns.

Next, [3] an application method in a case that the synthesis processing by using the detected signals from the plurality of detectors is applied to the pattern dimension measurement in the CDSEM will be explained.

Figure 15:
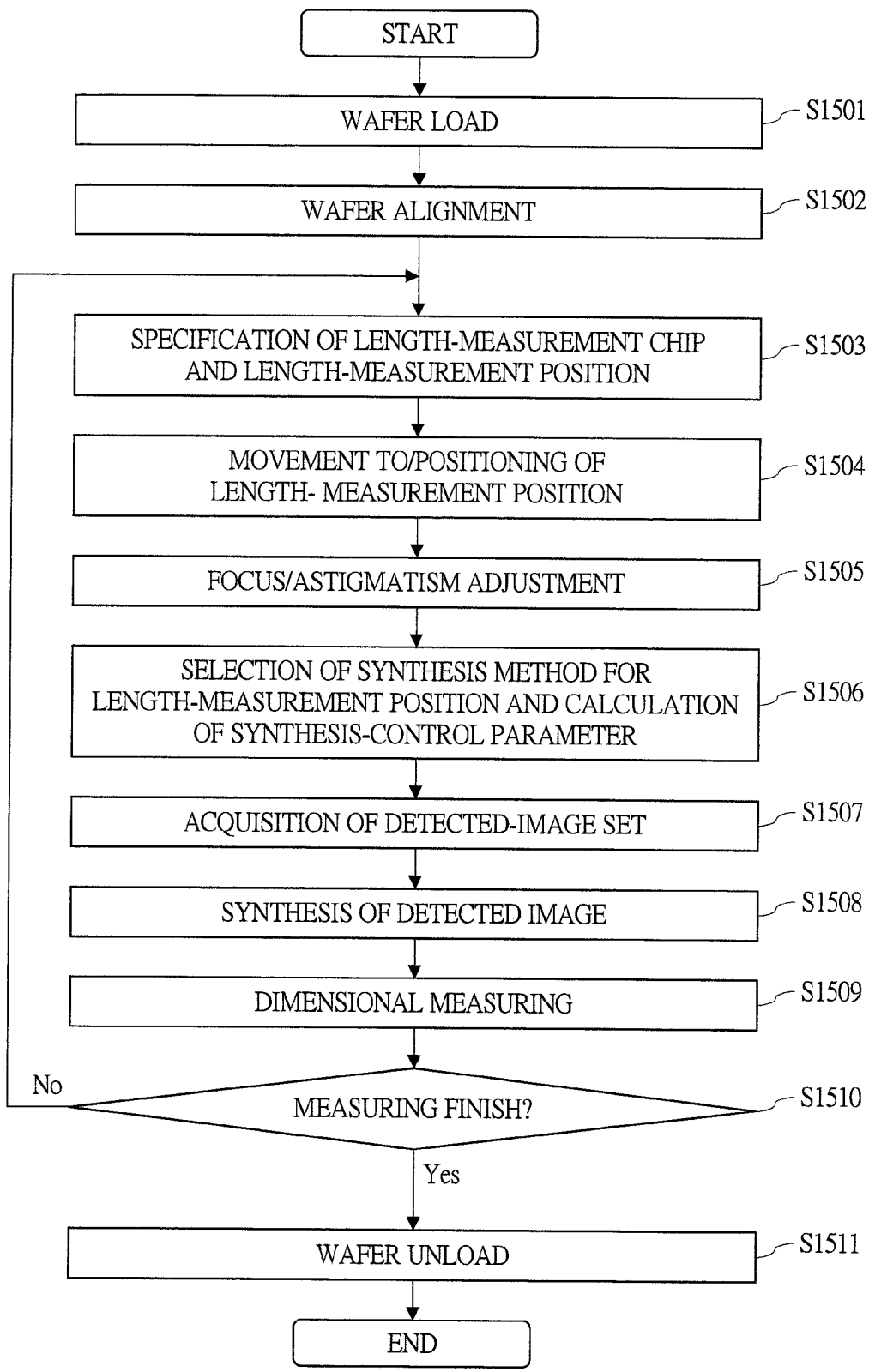
FIG. 15 is a flowchart illustrating one example of a case that a synthesis processing by using the detected signals from the plurality of detectors is applied to pattern dimension measurement in a CDSEM, in the first embodiment of the present invention.

In the case of the application to the pattern dimension measurement in the CDSEM, FIG. 15 illustrates a flow for performing the pattern dimension measurement after the synthesis by using the detected signals obtained from the plurality of detectors. First, a wafer is loaded onto the device similarly to the usual CDSEM measurement (S1501), and the position of the pattern on the wafer is calibrated by the wafer alignment (S1502). Next, while details will be omitted here, information required for the measurement such as chip arrangement on the wafer is previously inputted, and a length-measurement chip used for condition setting is specified, and then, a length-measurement position on the chip is specified by using a low-magnification SEM image (S1503). At this time, an image of a measured portion is stored as a template so as to be used for the measurement positioning alignment in the automatic measurement execution. In movement to the measured position in the automatic length measurement, a pattern may be searched by using the template so as to match each other in the periphery of the specified coordinate. When the portion to be measured inside the chip is determined, the wafer is moved by the stage so that the image of the specified position to be measured can be acquired, and precise positioning (S1504) and focusing/astigmatism adjustment (S1505) are performed by using a previously-set peripheral pattern, so that a non-blur image for the dimension measurement is obtained. And, the synthesis method of the length-measurement positions is selected and the synthesis control parameter is calculated (S1506). Then, the detected-image set of the measurement-object pattern is acquired from the plurality of detectors (S1507), and the detected images are synthesized (S1508) so as to clearly display the lower-layer pattern as well. And, the measurement of the pattern dimension on the wafer is performed (S1509). When the plurality of patterns on the same wafer are measured, the step S1503 to the step S1510 are repeated until the measurement is completed (S1510) so as to execute the dimension measurement or the image acquisition of all patterns. After the image acquisition is completed, the wafer is unloaded (S1511).

While FIG. 15 illustrates an example of the selection of the synthesis method and the calculation of the synthesis control parameter by online processing for the dimension measurement in the CDSEM, the selection of the synthesis method and the calculation of the synthesis control parameter by using the design data may be performed in a sequence such that the synthesis method and the synthesis control parameter are previously saved on the server as a file at offline and that the method and the parameter are retrieved by the online processing for the dimension measurement processing. In that case, instead of the step (S1506) of the selection of the synthesis method and the calculation of the synthesis control parameter for the length-measurement position, the retrieving of the synthesis method and the synthesis control parameter for the length-measurement position may be performed (although not illustrated).

While FIG. 15 is the example that the measurement is performed by synthesizing the detected images immediately after the acquisition of the detected-image set, only the detected images may be acquired, and the synthesis of the images and the dimension measurement may be separately performed. In that case, instead of the detected-image synthesizing step (S1508) and the dimension measuring step (S1509), image recording (not illustrated) or image transfer (not illustrated) may be performed, and the image data may be recorded in a recording medium, and the dimension processing may be separately performed.

Alternatively, one detected image with more detected signals of the measurement-object pattern may be selected from the acquired plurality of detected images, the dimension measurement may be performed by using this image, and the synthesis of the detected images and highly-accurate dimension measurement by using this synthesized image may be separately executed. In that case, the detected-image synthesizing step (S1508) may be changed to a step of selecting a measured image (not illustrated), and besides, image recording (not illustrated) or image transfer (not illustrated) may be performed, and the image data may be recorded in the recording medium, and the measurement processing may be separately performed.

Next, [4] a GUI used for the case of the application to the pattern dimension measurement in the CDSEM will be explained.

Figure 16:
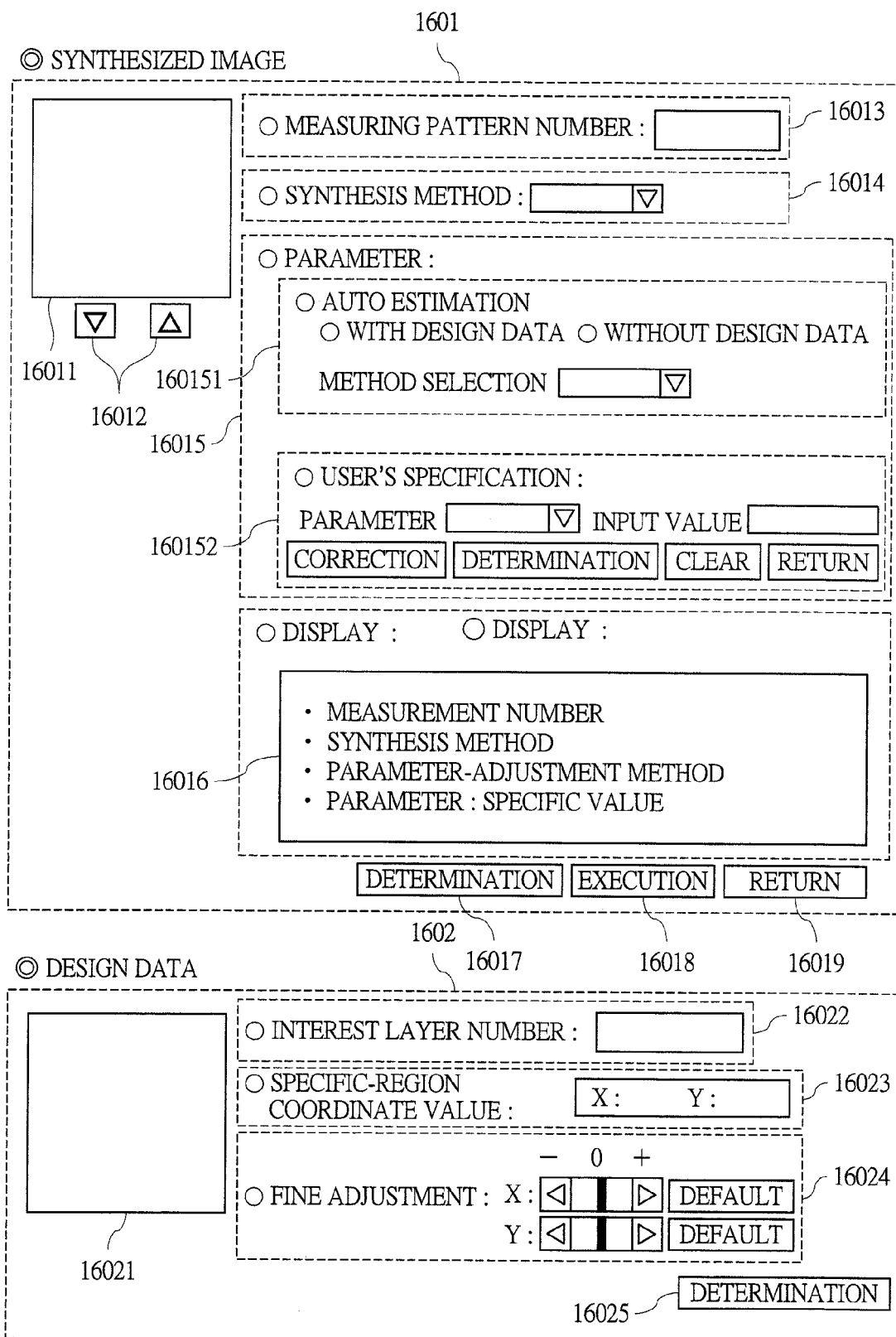
FIG. 16 is a diagram illustrating one example of a GUI screen used in the case of the application to the pattern dimension measurement in the CDSEM, in the first embodiment of the present invention.
Figure 17:
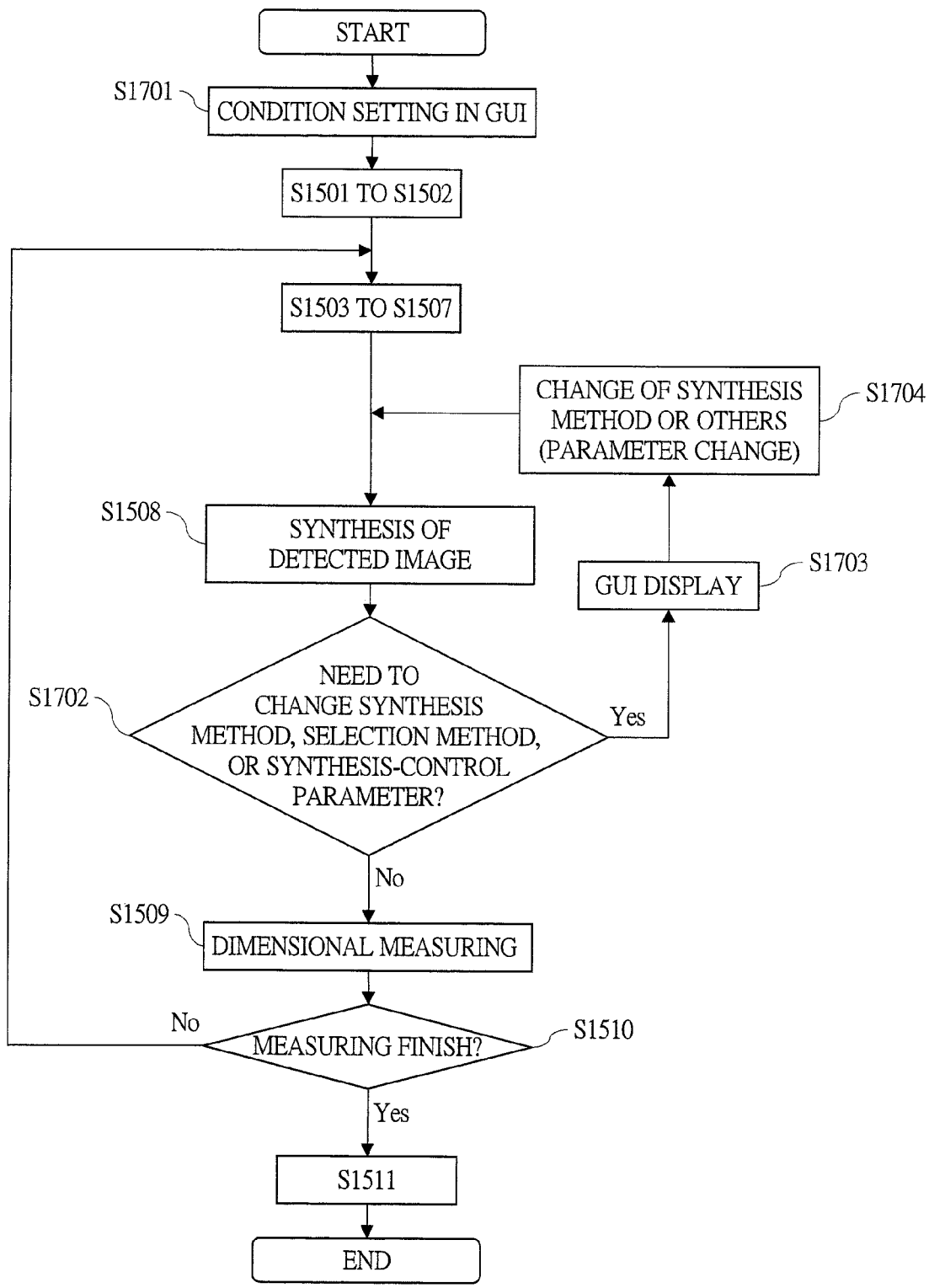
FIG. 17 is a flowchart illustrating one example for executing the process of the pattern dimension measurement by using the GUI screen in the first embodiment of the present invention.

FIG. 16 is a diagram illustrating one example of a GUI screen used in the case of the application to the pattern dimension measurement in the CDSEM. FIG. 17 is a flowchart illustrating one example for performing the processing of the pattern dimension measurement by using the GUI screen.

From the GUI screen as illustrated in FIG. 16, a user can be encouraged to input information of the specification of the region to which the dimension measurement is to be performed or information of the detected-image synthesis. The GUI screen is configured of: a display/setting screen 1601 for the synthesized image; and a display/setting screen 1602 for the design data.

In the display/setting screen 1601 for the synthesized image, the synthesis method or others is set by the user prior to the online processing in the CDSEM. In the setting of the synthesis method or others by the user, such as condition setting (S1701) on the GUI in FIG. 17, the user sets whether the design data is to be used or not, sets which calculation method of the synthesis control parameter by using the design data is to be used, sets that the selection of the synthesis method is to be performed by either an automatic default method or the specification by the user, sets that the parameter adjustment is to be performed either automatically or manually specified by the user, or sets others. Also, in a case that the processing is performed under different setting conditions depending on patterns, the screen is used when a message such as "need to change the synthesis method, the selection method of the synthesis method, and/or the synthesis control parameter" is shown (S1702) during the processing when the synthesis method, the selection method of the synthesis method, and/or the synthesis control parameter is needed to be changed, and when the display/setting screen 1601 for the synthesized image in the GUI is displayed (S1703) if needed, and then, when the synthesis method, the selection method of the synthesis method, and/or the synthesis control parameter is changed manually by the user (S1704).

In the display/setting screen 1601 for the synthesized image, the synthesized image is displayed on a screen 16011, and, if the user desires to redisplay the data that has been displayed in the past and saved in the storing unit 74, the images are switched by a button 16012. Further, as described above, in the case that the processing is desired to be performed under different setting conditions depending on patterns, it is required to specify a measurement-pattern number. Such a processing is performed by a panel 16013. If a plurality of numbers are to be specified, the numbers are connected by a mark of "," or "-". Also, regarding the synthesis method, several synthesis items such as the linear synthesizing, the non-linear synthesizing, the linear/non-linear synthesizing, and the dividing/synthesizing are selected by a synthesis-method button 16014.

Also, the parameter is adjusted by a panel 16015. There are two types of automatic estimation and user's specification. In an "automatic estimation" panel 160151, there are two options of "with design data" and "without design data". In the option of "with design data", there are three selected methods of the method by using the pattern direction of the design data, the method by using the pattern height information of the design data, and the method by using the degree of edge continuity of the detected image with taking the deformed design data as the reference. In the option of "without design data", there are two selected methods of the method by using the pattern direction calculated from the detected-image set, and the method by using information of the edge strength calculated from the detected-image set (they will be explained in detail later in a second embodiment). When a "user s specification" panel 160152 is selected, the manual specification is performed by a synthesis-method selecting column and a parameter adjusting column in the GUI in which there are some selectable parameter items corresponding to the respective synthesis methods, so that input values such as empirical values corresponding to the items can be inputted. Also, in both of the automatic estimation and the user's specification, the obtained parameter is displayed on the parameter-displaying panel. Further, in the "user's specification" panel 160152, a "determination" button for determining the parameter, a "correction" button for correction, a "clear" button for collectively deleting all parameters inputted by the user, and a "return" button for returning to a previously-inputted numerical value are provided.

Still further, a "determination" button 16017 for determining a selected condition or displaying the synthesized image in a simultaneously-setting status, an "execution" button 16018 for outputting a determined condition onto a dimension-measurement processing panel, and a "return" button 16019 for returning from a determined status to a preceding correctable status are also prepared.

The display/setting screen 1602 for the design data is for specifying a region or a layer of interest of the user. The present GUI screen includes: a screen 16021 for displaying the design data; a panel 16022 for inputting an interest layer number; a panel 16023 for inputting a coordinate value of the specified region; and a slider for finely adjusting the specified region and a "default" button 16024 for returning to a status prior to the fine adjustment. The region can also be specified by a mouse. In the input of the interest layer number, if two or more layers are inputted, the numbers are connected by the mark of "," or "-". Also, a "determination" button 16025 for termination upon the completion of the specification of the interest layer number or region is prepared.

The explanation for the basic embodiment of the present invention has been made above. According to the present embodiment, the contrast of the lower-layer pattern can be improved.

[5] A Method of Controlling an Image-Capturing Condition Will be Explained Below.

When the same image-capturing condition is employed for various multi-layer semiconductor patterns, the detected amount of the charged particles from the lower-layer patterns is small in some cases because the image-capturing condition is inappropriate. Accordingly, in order to obtain a sufficient detected amount of the emitted discharged particles from the lower-layer patterns, [5-1] a method of controlling the image-capturing condition by using the pattern direction of the design data and [5-2] a method of controlling the image-capturing condition by using the pattern height information of the design data will be explained.

Figure 18:
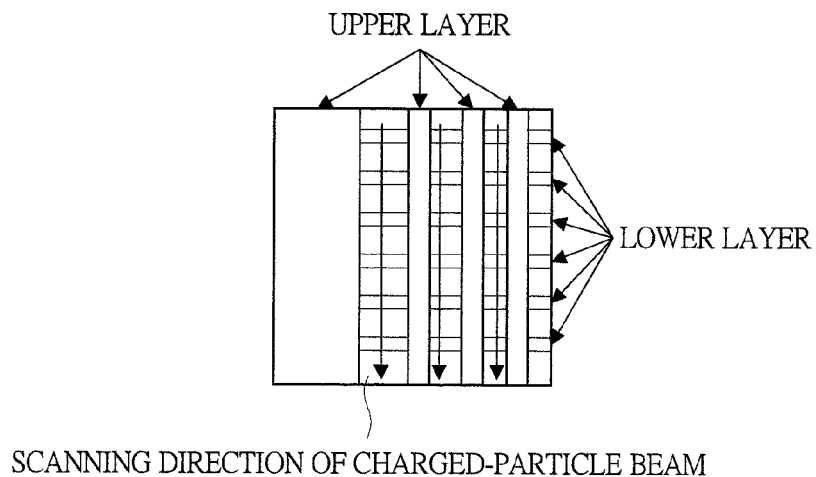
FIG. 18 is a diagram illustrating one example of controlling an image-capturing condition by using a pattern direction of the design data in the first embodiment of the present invention.

[5-1] Method of Controlling Image-Capturing Condition by Using Pattern Direction of Design Data Next, one example of controlling the image-capturing condition by using the pattern direction of the design data will be explained. In this example, as an example of optimization of the image-capturing condition, the characteristics are utilized, in which the amount of the charged particles emitted from the edge is increased by setting a direction of the beam scan so as to be perpendicular to the pattern edge direction of the pattern. In processing of this example, after the pattern direction of the design data is determined by using a directional filter, the direction of beam scan, which is one of the image-capturing conditions, is controlled to be the perpendicular direction with respect to the pattern direction. The present invention is not limited to this. FIG. 18 illustrates one example of controlling the image-capturing condition by using the pattern direction of the design data as a specific example. For example, when the edge direction of the lower-layer pattern is the lateral direction, a lot of amounts of the emitted charged particles from the lower-layer pattern can be obtained by longitudinally setting the scan direction of the charged particle beam.

Figure 19:
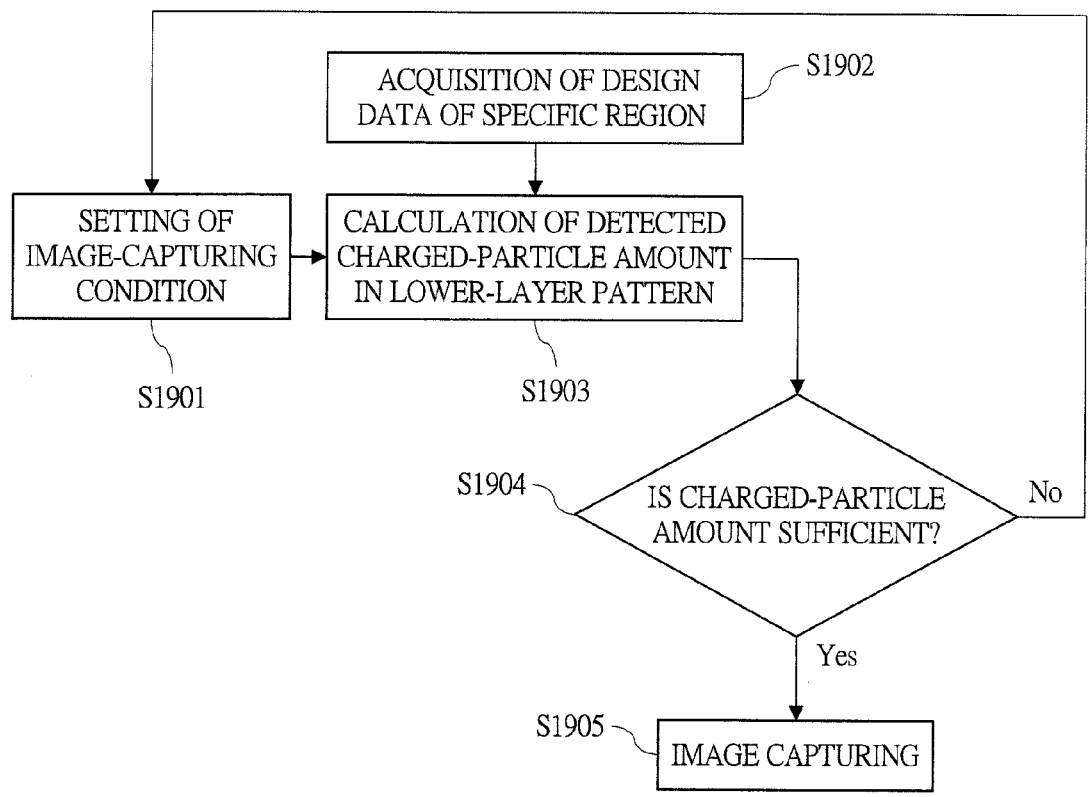
FIG. 19 is a diagram illustrating one example of controlling an image-capturing condition by using pattern height information of the design data in the first embodiment of the present invention.

[5-2] Method of Controlling Image-Capturing Condition by Using Pattern Height Information of Design Data FIG. 19 illustrates one example of controlling the image-capturing condition by using the pattern height information of the design data when the pattern height information of the design data exists. In this example, the image-capturing condition (such as an accelerating voltage, a probe current, a boosting current, or a beam scan direction) is set (S1901) based on the conversion lookup table or the model formula representing the conversion relationship between the angle β and the amount of the charged particles as illustrated in FIG. 12, the angle being formed between the horizontal surface of the lower-layer pattern and the continuous line toward vertex of the upper-layer pattern adjacent thereto, and the amount of the charged particles being emitted from the incident point A at which the upper-layer pattern can be detected, and then, one pair of the image-capturing conditions is inputted. Next, the design data of the specified region is acquired (S1902), and the angle β formed between the horizontal surface of the lower-layer pattern and the continuous line toward vertex of the upper-layer pattern adjacent thereto is calculated by using a distance between the upper-layer and lower-layer patterns and a relative height from the design data, the detected amount of the charged particles in the lower-layer pattern is calculated from the angle β (S1903), and it is determined (S1904) based on a previously-set threshold whether or not the detected amount of the charged particles has reached an appropriate amount. If the detected amount of the charged particles in the lower-layer pattern is insufficient, the processing returns to the setting of the image-capturing condition (S1901) for resetting the image-capturing condition, and the processing from the step of S1901 to the step of S1904 are repeated until the appropriate image-capturing condition is selected. If the detected amount of the charged particles therein is sufficient, the image is captured under the set condition (S1905).

In the above-described method of controlling the image-capturing condition, the example of one pair of the input image-capturing conditions has been explained. However, "n" pairs of the input image-capturing conditions may be used. In that case, the n pairs of the input image-capturing conditions are set in the image-capturing condition setting step (S1901). Further, instead of employing the step (S1904) of determining whether or not the detected amount of the charged particles from the lower-layer pattern has reached the appropriate amount based on the previously-set threshold, the image-capturing condition is selected from the n pairs of the input image-capturing conditions so that an image-capturing condition having the highest detected amount of the charged particles from the lower-layer pattern is a practical image-capturing condition.

As explained above, according to the present embodiment, the contrast of the lower-layer pattern can be improved by controlling the synthesis of the detected signals in the lower layer, which are obtained by the plurality of detectors 711, based on the information of the pattern direction of the design data, the degree of edge continuity of the design data and the detected image, the pattern height information of the design data, or others. As a result, the high-contrast image of the lower-layer pattern in the fine and high-aspect multi-layer semiconductor pattern can be synthesized, so that the image quality can be improved.

Second Embodiment

A second embodiment of the present invention will be explained with reference to FIGS. 20 and 21.

The present embodiment is an example of synthesis by using information of the pattern direction or the edge strength calculated from the detected image. While FIG. 8 of the first embodiment illustrates one example of the synthesis by using the design data, the present embodiment illustrates an example of synthesis by using the information of the pattern direction or the edge strength calculated from the detected image. In this case, the positioning-alignment/deforming step (S8002) of the design data in FIG. 8 is eliminated, and, instead of performing the synthesis-method selecting step (S8003) and the synthesis control parameter calculating step (S8004) by using the design data, they may be calculated from the detected-image set.

Next, a calculating method of calculating the synthesis control parameter from the detected-image set will be explained.

(1) Calculation of Synthesis Control Coefficient from Detected-Image Set

As for the calculating method of calculating the synthesis control parameter from the detected-image set, two methods of (1-1) a method by using the pattern direction calculated from the detected-image set and (1-2) a method by using the information of the edge strength calculated from the detected-image set will be explained.

(1-1) Method by Using Pattern Direction Calculated from Detected-Image Set

Figure 20:
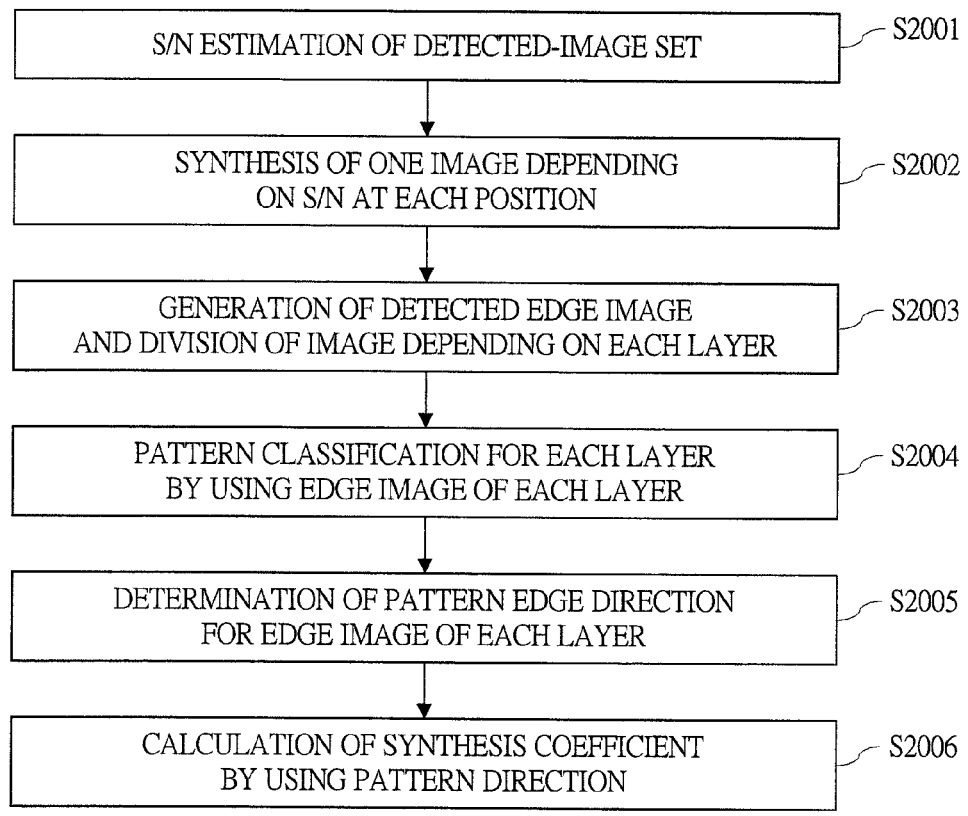
FIG. 20 is a diagram illustrating one example of calculating a synthesis controlling coefficient by using a pattern direction calculated from a detected image set, in a second embodiment of the present invention.

FIG. 20 illustrates one example of the calculation of the synthesis control coefficient by using the pattern direction calculated from the detected-image set. In this example, first, S/N estimation (S2001) of the detected-image set is performed for selecting a pixel value having high S/N for each position from the detected-image set, and one image is generated by using these pixel values (S2002). Next, a detected edge image is generated by extracting a pattern contour of the generated image, and is divided depending on a layer (S2003). Although there are various methods of extracting the contour, for example, a method disclosed in Japanese Patent Application Laid-Open Publication No. 2009-44070 (Patent Document 4) or others is applicable. Further, a pattern of each layer is classified (S2004) by using the edge image of each layer, a pattern edge direction is determined (S2005) for the edge image of each layer, and a synthesis coefficient is calculated (S2006) by using the pattern direction.

Figure 21:
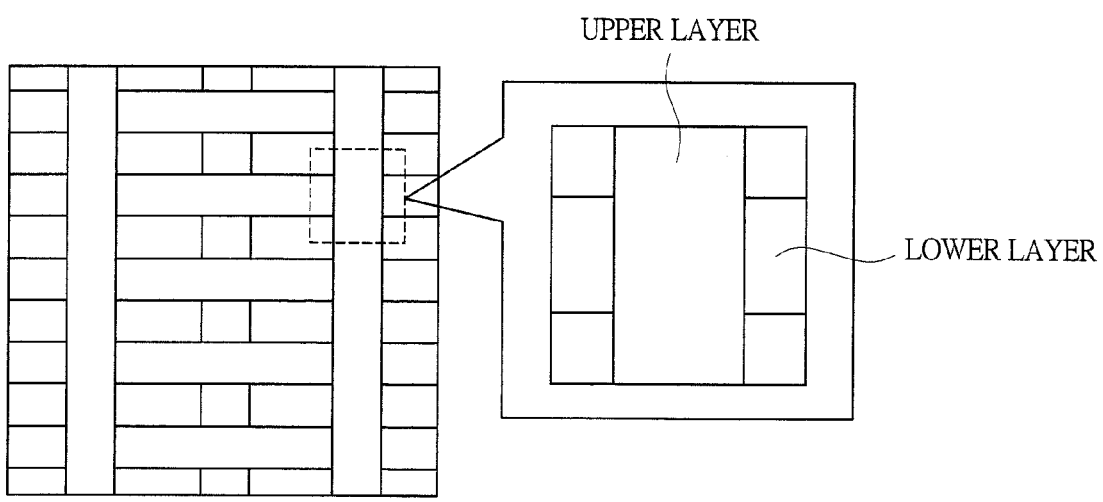
FIG. 21 is a diagram illustrating one example of a concept of layer-dependent division by using an edge image in the second embodiment of the present invention.

Regarding the processing (S2003) of the division for each layer by using the edge image, FIG. 21 illustrates one example of a concept of the layer-dependent division by using the edge image. This drawing illustrates an example of a three-layer semiconductor pattern with taking at least one natural number "N" which is 2 or larger. A crossing portion between an upper layer and a lower layer is used, a layer without a cutoff pattern is determined to be the upper layer, and a layer with the cutoff pattern is determined to be the lower layer, so that a vertically-structured relationship between the upper layer and the lower layer is recognized. Still further, at the crossing portion, each layer can be divided by determining that a layer is the uppermost layer if the layer is upper than all other layers, that a layer is the lowermost layer if the layer is lower than all other layers, and that a layer is an intermediate layer if the layer is lower than only the uppermost layer or lower than other layers except for the uppermost layer.

Regarding the processing of classifying the pattern for each layer (S2004) by using the edge image of each layer, a template image of a standard pattern is used, so that the pattern is extracted and classified by using a degree of similarly with the template image.

Regarding the processing of determining the pattern edge direction for the edge image of each layer (S2005), the pattern edge direction can be determined by a filtering processing by using a directional filter.

And, similarly to the method (2-1-1) by using the pattern direction of the design data in the first embodiment, the weight coefficient may be calculated by providing a small weight coefficient if there is the upper-layer pattern and providing a large weight coefficient if there is no upper-layer pattern.

(1-2) Method by Using Information of Edge Strength Calculated from Detected-Image Set Next, one example of calculating the synthesis control coefficient by using the information of the edge strength calculated from the detected-image set will be explained. In this example, the degree of continuity of the detected image is used similarly to the method (2-1-2) by using the degree of edge continuity of the design data and the detected image of the first embodiment. However, here, it is assumed that a detector with the most pixels of projection in a line pattern direction of a detected line pattern signal is a reference, and that the degree of edge continuity of the detected line pattern signal obtained from this detector is 1. In this case, the weight coefficient may be similarly set to satisfy the condition of "$\alpha_i = q_i / \Sigma q_i$".

As the present embodiment, the method of calculating the synthesis coefficient only from the detected-image set without using the design data is advantageous in that the saving of a large amount of design data is not required and that additional work for the synthesis processing in the DRSEM without using the design data is not required.

Third Embodiment

Figure 22:
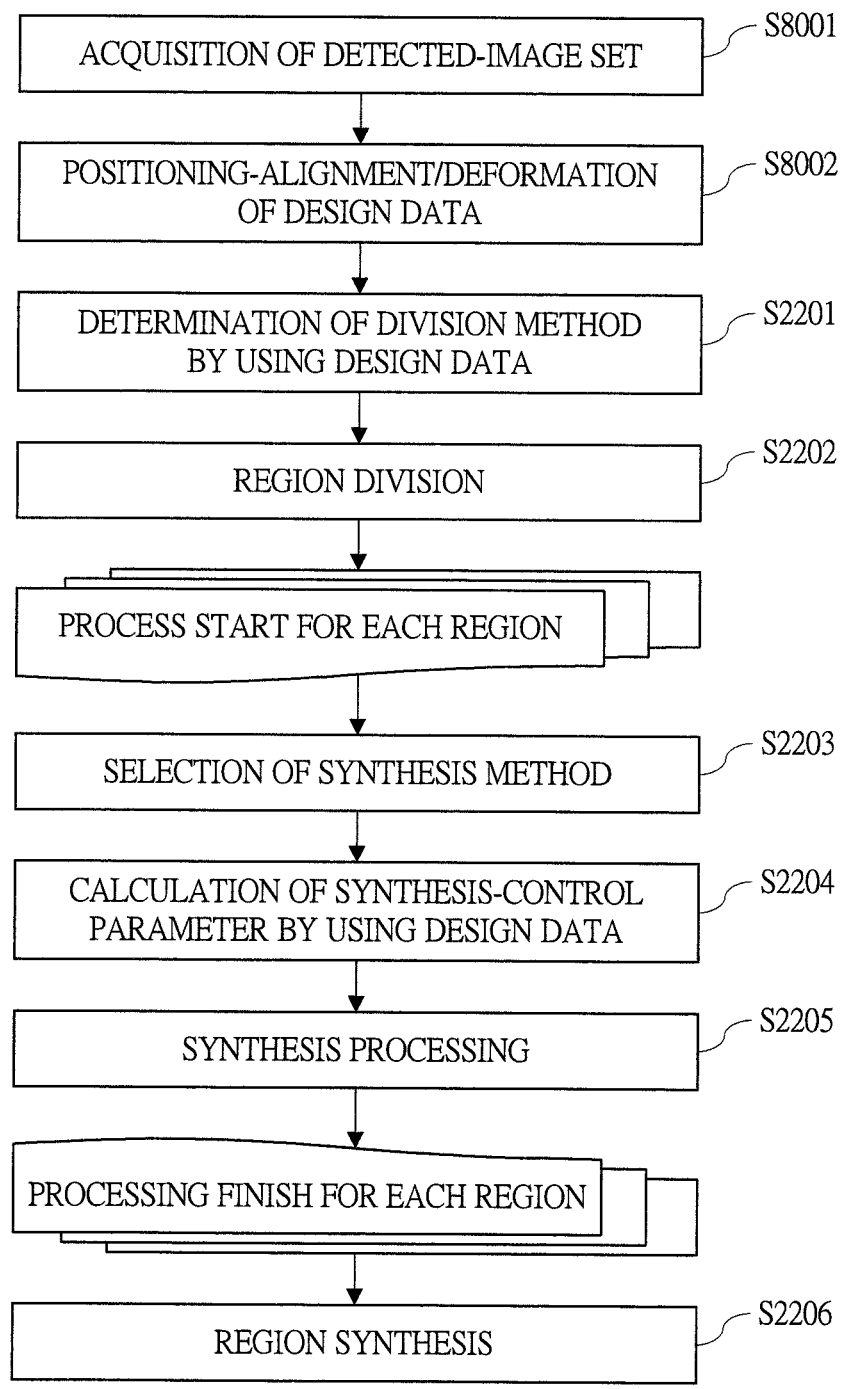
FIG. 22 is a diagram illustrating a modified example (with region division/synthesis) of synthesis by using a design data in a third embodiment of the present invention.
Figure 23A:
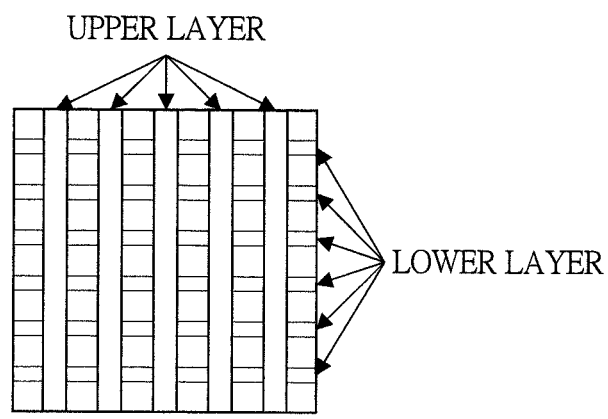
FIGS. 23A and 23B are diagrams illustrating one example of a concept of layer-dependent division or pattern-dependent division in a dividing method by using the design data in the third embodiment of the present invention.
Figure 23B:
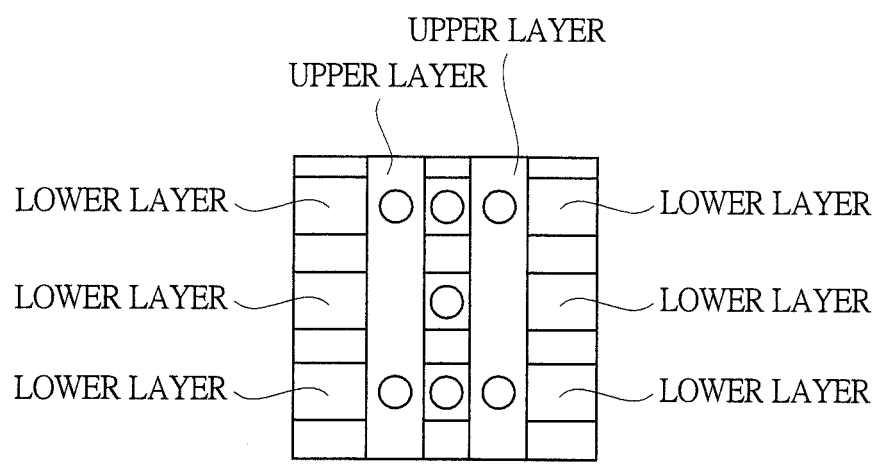

A third embodiment of the present invention will be explained with reference to FIGS. 22 to 23B.

The present embodiment is a modified example of the synthesis by using the design data. With reference to FIG. 22, another example of the synthesis by using the design data will be explained. FIG. 22 is a diagram illustrating a modified example of the synthesis by using the design data (with regional division/synthesis). In the present embodiment, similarly to the first embodiment of FIG. 8, the detected-image set is first acquired (S8001), and then, positioning-alignment/deformation of the design data is performed (S8002). And, the division method is determined (S2201) by using the design data, and the regional division is performed (S2202) for each detected image. The regional division may either be layer-dependent regional division or regional division depending on a different wiring pattern. Next, a processing is started for each divided region to select the synthesis method for each position (S2203), the synthesis control parameter is calculated (S2204) by using the design data, and the synthesis processing is performed (S2205). Then, the processing for each region is terminated to synthesize the region (S2206).

In the step (S2201) of determining the division method by using the deformed design data 803, it is determined to divide depending on either only layer or also pattern. This determination is judged depending on pattern arrangement. FIGS. 23A and 23B illustrate one example of a concept of this layer-dependent division/pattern-dependent division. For example, the upper/lower-layer-dependent division is sufficient in a case of a simple line pattern as illustrated in FIG. 23A. However, in a case of a semiconductor pattern in which a line pattern and a circular hole pattern simultaneously exist as illustrated in FIG. 23B, the layer-dependent division is performed, and then, the pattern-dependent division is further performed for the line pattern and the hole pattern which are different from each other, so that better synthesizing effect can be obtained. In the synthesis processing (S2205), synthesis is similarly performed by using the deformed design data 803 so as to reverse the division. However, in the synthesis in a boundary region or a region in vicinity of the boundary, the boundaries are smoothly joined by a mixing processing of pixel values. In the mixing processing, for example, linear interpolation may be used.

Also, regarding the determination of the synthesis method depending on the layer region or the pattern region and the method of calculating the synthesis control parameter, the synthesis method by using the design data as illustrated in FIG. 8 of the first embodiment may be used.

As the present embodiment, the regional division is advantageous in that the synthesizing effect can be improved, and besides, the better synthesizing effect can be obtained by performing the layer-dependent division followed by the pattern-dependent division.

Fourth Embodiment

A fourth embodiment of the present invention will be explained with reference to FIG. 24.

The present embodiment is a modified example of the application method. While the example of applying the synthesis processing by using the detected signals obtained from the plurality of detectors in the CDSEM has been explained in the first embodiment, an example of applying the synthesis processing by using the detected signals obtained from the plurality of detectors in the DRSEM will be explained in the present embodiment.

Figure 24:
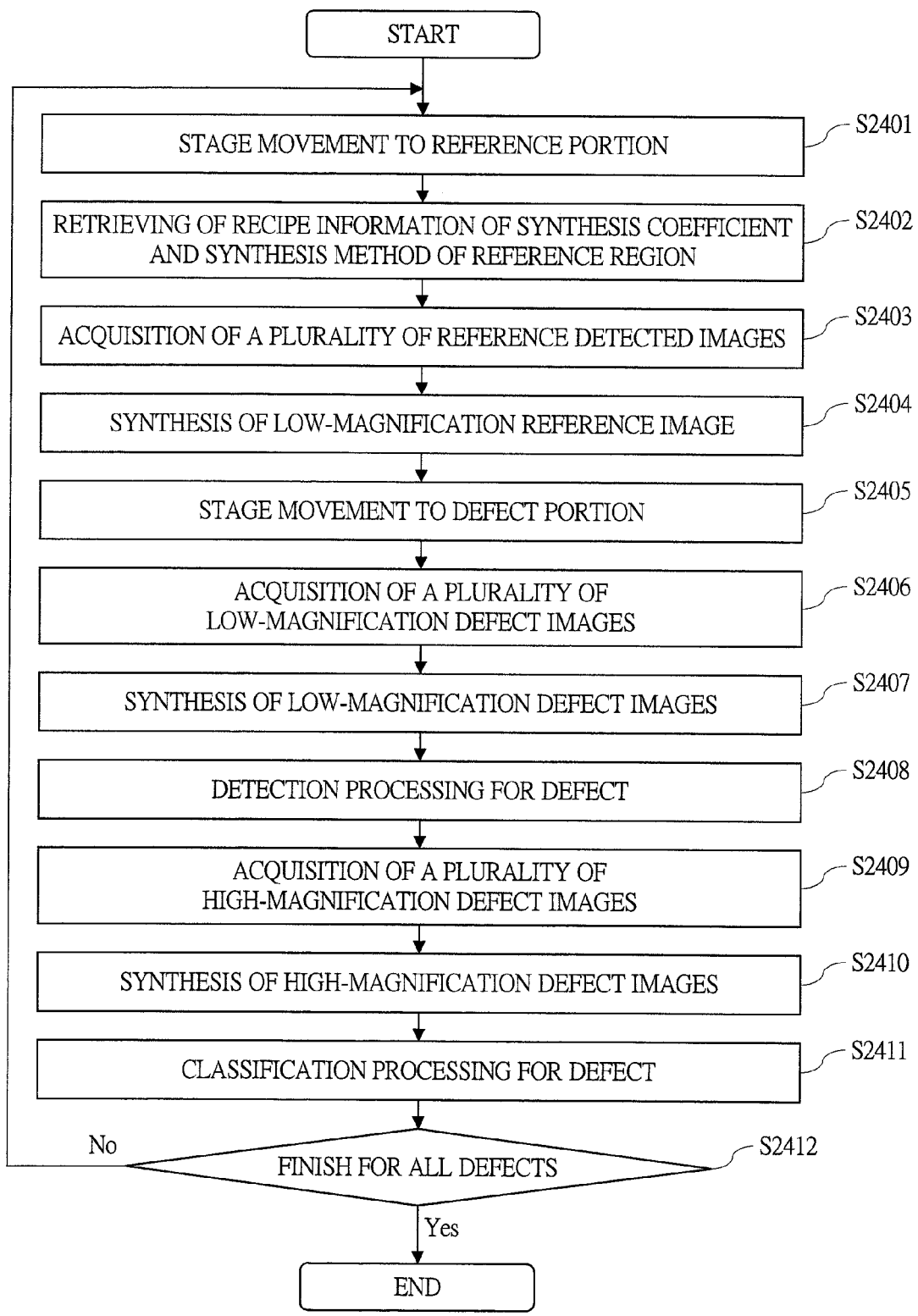
FIG. 24 is a flowchart illustrating one example in a case that a synthesis processing by using detected signals from a plurality of detectors is applied to defect review in a DRSEM, in a fourth embodiment of the present invention.

FIG. 24 illustrates a flowchart of one example in the case that the synthesis processing by using the detected signals obtained from the plurality of detectors is applied to the defect review in the DRSEM. When a plurality of charged-particle detectors are used, it is required to synthesize a detected image several times even for performing defect extraction once in the defect review. Therefore, while an example of synthesis by calculating a synthesis coefficient for all images at online is considered, it is of disadvantage that time for the processing is huge in actual application.

Accordingly, FIG. 24 illustrates a sequence which previously calculates the synthesis coefficient and the synthesis method from the design data or the detected image, and then, saves them as a part of an image-capturing recipe, and retrieves them at the time of the actual application. Explanations will be made with reference to FIG. 7. First, prior to the image capturing, a sample 713 such as a wafer is mounted onto the XY stage 714. The user selects a measurement recipe through the input-output I/F 72 from a plurality of recipes registered on the server 79, and instructs the controlling unit 75 to perform ADR and ADC under a condition as stored therein. Then, the controlling unit 75 reads the coordinate information of defect from the storing unit 74. The read coordinate information of each defect is used to perform steps S2401 to S2412 explained below, so that a defect image is collected.

First, in order to capture a low-magnification reference image by using the coordinate information of an observation-object defect read from the storing unit 74, the XY stage 714 is moved (S2401) so that an image-captured region of an adjacent chip which corresponds to this defect coordinate position can be irradiated with the electron beam. Next, recipe information related to a synthesis coefficient and a synthesis method of the reference region saved on the server 79 prior to the capture of the low-magnification reference image is retrieved (S2402). And, a plurality of reference detected images are acquired (S2403), and the low-magnification reference image is synthesized (S2404) by using the retrieved synthesis coefficient and synthesis method. Then, the low-magnification defect image is captured. Similarly to the capture of the low-magnification reference image, the XY stage 714 is moved (S2405) by using coordinate information of an observation-object defect. And, a plurality of low-magnification defect images are acquired (S2406), and then, a low-magnification defect image is synthesized (S2407) by using a synthesis coefficient and a synthesis method of a reference image to perform the processing of the defect detection (S2408). Next, a plurality of high-magnification defect images are acquired (S2409), the high-magnification defect images are synthesized (S2410) by the similar method described above, and a defect classification processing is performed (S2411). The steps S2401 to S2411 are repeated until all defect images are acquired, and then, the processing for all defects are terminated (S2412).

In the application for the DRSEM, the GUI illustrated in FIG. 16 may be used. However, in the usage, the input column panel 16013 for the measurement pattern number may be changed to the one for a defect number. The synthesis processing is used for not only the pattern dimension measurement and the defect detection but also pattern shape measurement and defect classification.

As the present embodiment, the synthesis processing by using the detected signals obtained from the plurality of detectors can also be applied to the CDSEM.

In the foregoing, the invention made by the inventors has been concretely described based on the embodiments. However, it is needless to say that the present invention is not limited to the foregoing embodiments and various modifications and alterations can be made within the scope of the present invention.

INDUSTRIAL APPLICABILITY

A charged particle beam device according to the present invention is available for a method of improving image quality by using detected images obtained from a plurality of detectors, and also applicable for not only SEM such as CDSEM and DRSEM but also SIM.

SYMBOL EXPLANATION

71 . . . image-capturing unit, 72 . . . input-output I/F, 73 . . . processing unit, 74 . . . storing unit, 75 . . . controlling unit, 76 . . . image-generating unit, 77 . . . signal-synthesizing unit, 78 . . . input-output terminal, 79 . . . server, 501 . . . charged particle beam, 502 . . . detector, 503 . . . sample, 504 . . . stage, 505 . . . detected-image synthesis, 506 . . . synthesized image, 507 . . . detected signal, 601 . . . design data, 602 . . . detected-image synthesis, 603 . . . synthesized image, 700 . . . primary electron beam, 701 . . . deflected primary electron beam, 702 . . . electron beam, 703 . . . alignment coil, 704 . . . condenser lens, 705 . . . astigmatism correction coil, 706 . . . and 707 . . . deflector, 708 . . . boosting electrode, 709 . . . objective lens, 710 . . . objective lens aperture, 711 . . . detector (reflection/secondary electron detector), 712 . . . A/D converter, 713 . . . sample, 714 . . . XY stage, 771 . . . design-data processing unit, 772 . . . synthesis-method controlling unit, 773 . . . synthesizing unit

The invention claimed is:

1. A method of improving image quality of a charged particle beam device, the method comprising:
   a charged particle beam irradiating step of irradiating and scanning charged particle beam converged over a sample that is an object to be image-captured;
   a detected image generating step of detecting secondary charged particles or reflection charged particles generated from the sample by the charged particle beam by using two or more detectors that are arranged at different locations and of generating detected images corresponding to respective outputs of the detectors; and
   a detected image synthesizing step by a method of synthesizing the number of output images less than the number of the detectors based on pattern information by using the detected image or a method of synthesizing the number of output images less than the number of the detectors by calculating a synthesis control parameter,
   wherein the detected image synthesizing step calculates a direction-dependent blocking state of scattered electrons based on pattern information, and determines a synthesis ratio based on the blocking state.

2. The method of improving image quality of a charged particle beam device according to claim 1,
   wherein the blocking state is calculated based on a distance between a peripheral pattern of the pixel and the pixel.

3. The method of improving image quality of the charged particle beam device according to claim 1,
   wherein the blocking state is calculated based on a relative ratio between a height in a peripheral pattern of the pixel and a height in the pixel.

4. The method of improving image quality of the charged particle beam device according to claim 1,
   wherein, in the detected image synthesizing step, an edge component corresponding to edge contained in the design data is extracted from each of the detected images and a degree of edge continuity of the edge component is used.

5. The method of improving image quality of the charged particle beam device according to claim 1, wherein, in the charged particle beam irradiating step, a signal intensity of the output images generated in the output image generating step or of the detected images generated in the detected image generating step is estimated for each of one or more sets of image-capturing condition by using the design data or an output image or detected image generated in the past, one set of the image-capturing condition is determined based on the estimated signal intensity, and the converged charged particle beam is irradiated and scanned over the sample that is the object to be image-captured by using the determined image-capturing condition.

6. The method of improving image quality of the charged particle beam device according to claim 1,
wherein, in the detected image synthesizing step, the method of generating the output images is controlled by using a result of determination obtained by, among the detected images, determining an image which relatively contains a lot of signals of an "N th" layer counted from the uppermost layer in the design data by using information of a pattern shape or a pattern direction of at least one layer among layers from the uppermost layer to a first through "N−1 th" layer, in which "N" is at least one natural number of 2 or larger.

7. The method of improving image quality of the charged particle beam device according to claim 1,
wherein, in the detected image synthesizing step, the method of generating the output images is controlled by using a result of determination obtained by dividing an image corresponding to output of each of the detectors into two or more layers, and, among the detected images, determining an image which relatively contains a lot of signals of an "N th" layer counted from the uppermost layer, that is obtained by the dividing, by using information of a pattern shape or a pattern direction of at least one layer among layers from the uppermost layer to a first through "N−1 th" layer, in which "N" is at least one natural number of 2 or larger.

8. A charged particle beam device comprising:
a charged particle gun for irradiating charged particle beam;
a lens for converging the charged particle beam;
a scanning device for scanning the charged particle beam converged over a sample that is an object to be image-captured;
two or more detectors for detecting secondary charged particles or reflected charged particles emitted from or transmitted through the sample;
a detected-image generator for generating detected images corresponding to respective outputs of the detectors;
a detected-image synthesizer for synthesizing the number of output images less than the number of the detectors based on pattern information by using the detected image or synthesizing the number of output images less than the number of the detectors by calculating a synthesis control parameter,
wherein the detected-image synthesizer calculates a direction-dependent blocking state of scattered electrons based on pattern information, and determines a synthesis ratio based on the blocking state.

9. The charged particle beam device according to claim 8,
wherein the charged particle beam device further includes an image-capturing condition controller for estimating a signal intensity of output images generated in the detected-image synthesizer for each of one or more sets of image-capturing condition by using the design data or an output image generated in the past, determining one set of the image-capturing condition based on the estimated signal intensity, and controlling at least one of the charged particle gun, the lens, and the scanning device by using the determined image-capturing condition.

10. The charged particle beam device according to claim 8,
wherein the detected-image synthesizer controls the method of generating the output images by using a result of determination obtained by, among the detected images, determining an image which relatively contains a lot of signals of an "N th" layer counted from the uppermost layer in the design data by using information of a pattern shape or a pattern direction of at least one layer among layers from the uppermost layer to a first through "N−1 th" layer, in which "N" is at least one natural number of 2 or larger.

11. The charged particle beam device according to claim 8,
wherein the detected-image synthesizer controls the method of generating the output images by using a result of determination obtained by dividing an image corresponding to output of each of the detectors into two or more layers, and, among the detected images, determining an image which relatively contains a lot of signals of an "N th" layer counted from the uppermost layer in the design data by using information of a pattern shape or a pattern direction of at least one layer among layers from the uppermost layer to a first through "N−1 th" layer, in which "N" is at least one natural number of 2 or larger.

12. The charged particle beam device according to claim 8,
wherein the blocking state is calculated based on a distance between a peripheral pattern of the pixel and the pixel.

13. The charged particle beam device according to claim 8,
wherein the blocking state is calculated based on a relative ratio between a height in a peripheral pattern of the pixel and a height in the pixel.

14. The charged particle beam device according to claim 8,
wherein the detected-image synthesizer extracts an edge component corresponding to edge contained in the design data from each of the detected images, and uses a degree of edge continuity of the edge component.

* * * * *